United States Patent
Saxena et al.

(10) Patent No.: US 12,242,949 B2
(45) Date of Patent: Mar. 4, 2025

(54) COMPUTE-IN-MEMORY DEVICES, SYSTEMS AND METHODS OF OPERATION THEREOF

(71) Applicant: Infineon Technologies LLC, San Jose, CA (US)

(72) Inventors: Prashant Kumar Saxena, Fremont, CA (US); Vineet Agrawal, San Jose, CA (US); Venkatraman Prabhakar, Pleasanton, CA (US)

(73) Assignee: Infineon Technologies LLC, San Jose, CA (US)

( * ) Notice: Subject to any disclaimer, the term of this patent is extended or adjusted under 35 U.S.C. 154(b) by 1011 days.

(21) Appl. No.: 17/215,372

(22) Filed: Mar. 29, 2021

(65) Prior Publication Data
US 2022/0309328 A1    Sep. 29, 2022

(51) Int. Cl.
  *G06N 3/08*   (2023.01)
  *G06F 7/544*  (2006.01)
  *G06N 3/063*  (2023.01)
  *G11C 16/04*  (2006.01)
  *G11C 16/24*  (2006.01)
  *H03M 1/12*   (2006.01)

(52) U.S. Cl.
  CPC ........... *G06N 3/063* (2013.01); *G06F 7/5443* (2013.01); *G06N 3/08* (2013.01); *G11C 16/0466* (2013.01); *G11C 16/24* (2013.01); *H03M 1/12* (2013.01)

(58) Field of Classification Search
  None
  See application file for complete search history.

(56) References Cited

PUBLICATIONS

Wang, et al., Three-Dimensional NAND Flash for Vector-Matrix Multiplication, IEEE Transactions on Very Large Scale Integration (VLSI) Systems, vol. 27, No. 4, Apr. 2019, pp. 988-991 (Year: 2019).*
Chen, et al., Multiply accumulate operations in memristor crossbar arrays for analog computing, Journal of Semiconductors, 2021, pp. 1-6 (Year: 2021).*
Joshi, et al., Accurate deep neural network inference using computational phase-change memory, Nature Communications 11(1), 2020, pp. 1-14 (Year: 2020).*
Singh, et al., CIDAN-XE: Computing in DRAM with Artificial Neurons, Frontiers in Electronics, vol. 3, Article 834146, Feb. 18, 2022, pp. 1-17 (Year: 2022).*
Tridgell, et al., Doctoral Thesis, Low Latency Machine Learning on FPGAs, The University of Sydney Australia, Jul. 27, 2020, pp. 1-143 (Year: 2020).*

(Continued)

*Primary Examiner* — Wilbert L Starks

(57) ABSTRACT

A method can include, for each row of a nonvolatile memory (NVM) cell array, generating a multiply-accumulate (MAC) result for the row by applying input values on bit lines. Each MAC result comprising a summation of an analog current or voltage that is a function of each input value modified by a corresponding weight value stored by the NVM cells of the row. By operation of at least one multiplexer, one of the rows can be connected to an analog-to-digital converter (ADC) circuit to convert the analog current or voltage of the row into a digital MAC value. A storage element of each NVM cell can be configured to store a weight value that can vary between no less than three different values. Corresponding devices and systems are also disclosed.

19 Claims, 21 Drawing Sheets

(56) References Cited

PUBLICATIONS

Bouvier, Study and design of an energy efficient perception module combining event-based image sensors and spiking neural network with 3D integration technologies, Doctoral Thesis, University of Grenoble Alps, Jun. 9, 2021, pp. 1-162 (Year: 2021).*

* cited by examiner

|  | $V_{BL+}$ | $V_{BL-}$ |
|---|---|---|
| $X_j$ (pos) | H | L |
| $X_j$ (neg) | L | H |
| no $X_j$ value | $V_{SL}$ | $V_{SL}$ |
FIG. 4
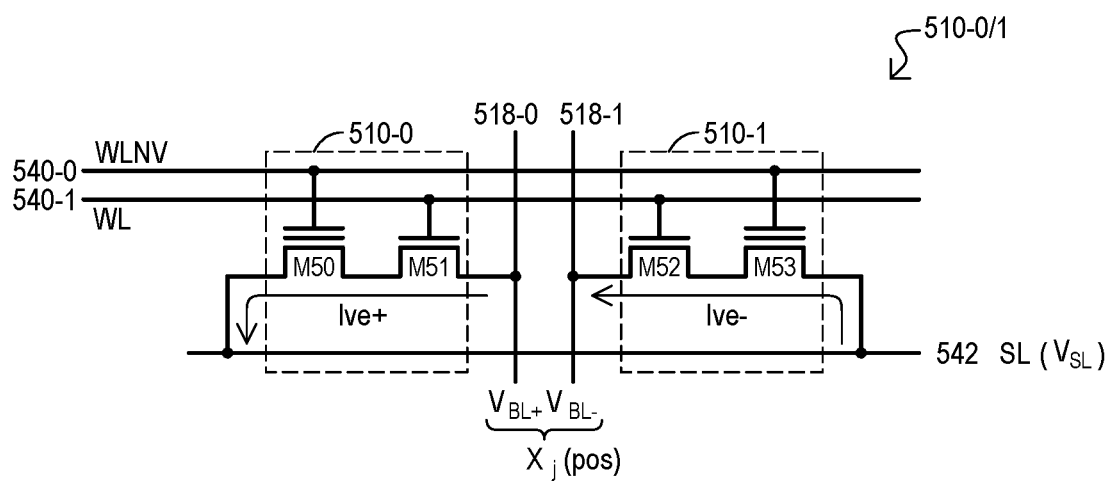
FIG. 5A
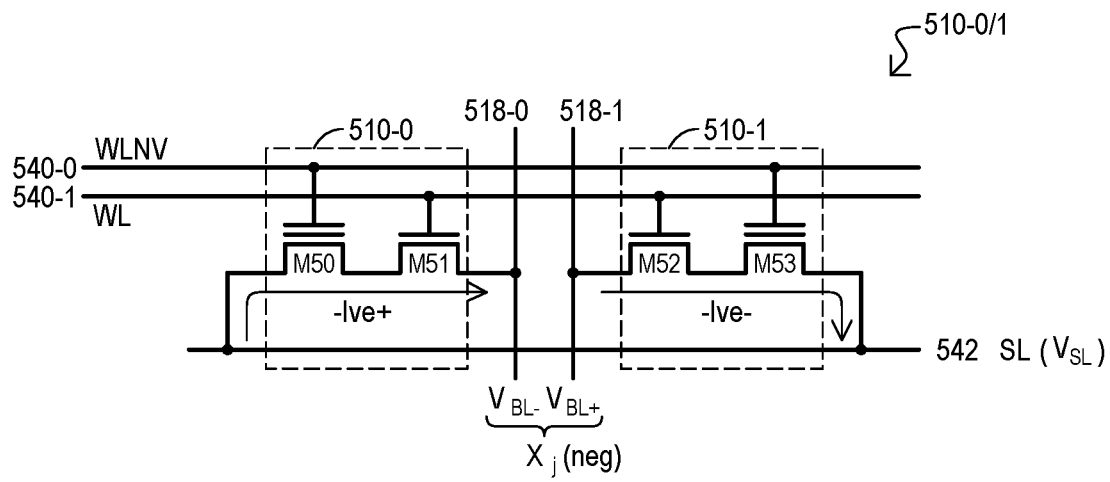
FIG. 5B (BACKGROUND)

$$\begin{bmatrix} V_1 \\ V_2 \\ V_3 \end{bmatrix} \times \begin{bmatrix} G_{1,1} & G_{2,1} & G_{3,1} \\ G_{1,2} & G_{2,2} & G_{3,2} \\ G_{1,3} & G_{2,3} & G_{3,3} \end{bmatrix} = \begin{bmatrix} I_1 \\ I_2 \\ I_3 \end{bmatrix}$$

$$I_1 = \sum V_i \, G_{i,1} \quad I_2 = \sum V_i \, G_{i,2} \quad I_3 = \sum V_i \, G_{i,3}$$

(BACKGROUND)

(BACKGROUND)

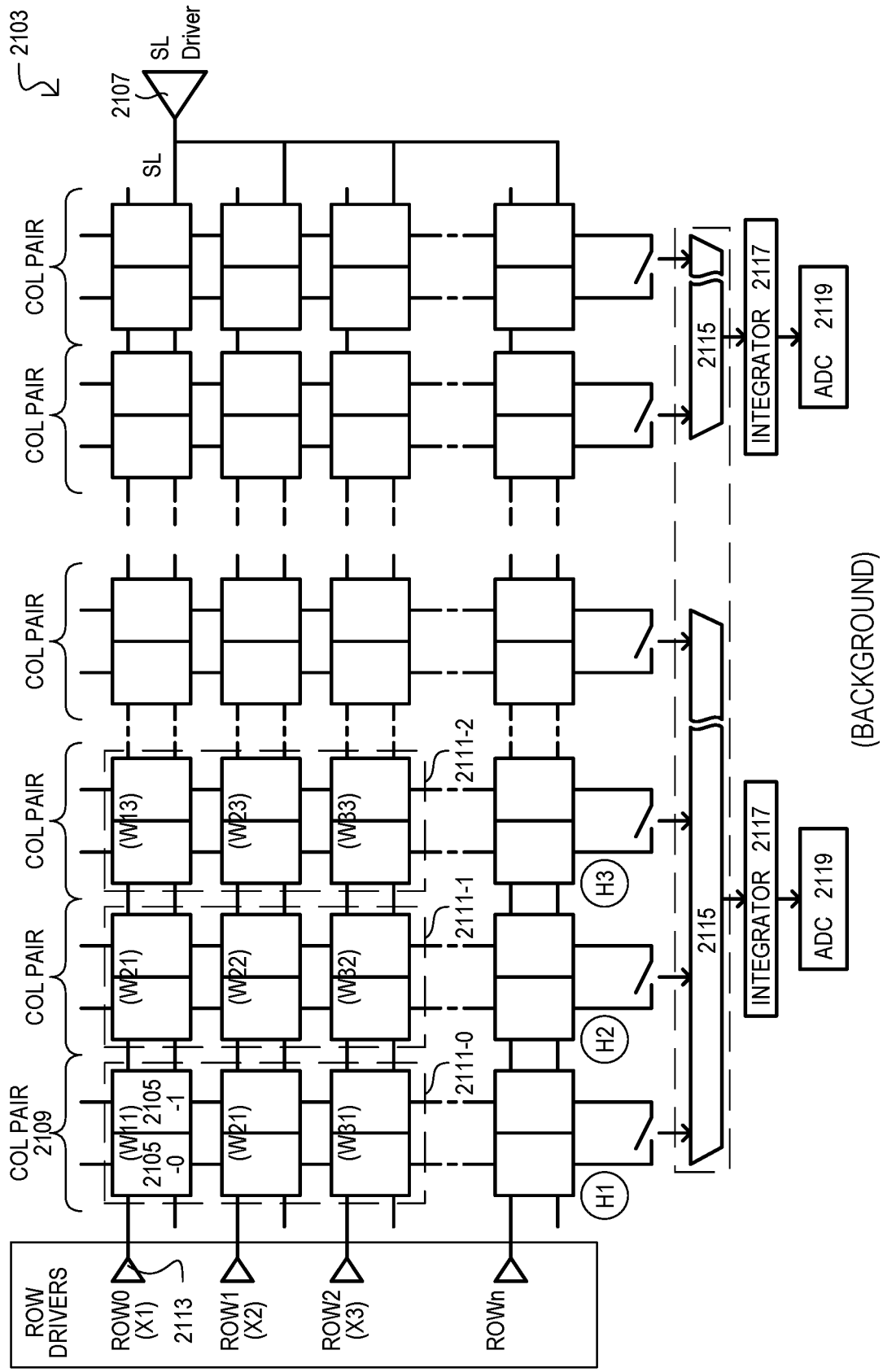
(BACKGROUND) FIG. 21

(BACKGROUND)

COMPUTE-IN-MEMORY DEVICES, SYSTEMS AND METHODS OF OPERATION THEREOF

TECHNICAL FIELD

The present disclosure relates generally to compute-in-memory devices (CIM), and more particularly, to nonvolatile CIM devices configurable to execute multiply-accumulate (MAC) operations for use in applications such as neural networks.

BACKGROUND

Circuits that can execute multiply-accumulate (MAC) operations can be desirable additions to many systems. One such system can be an artificial neural network (ANN). FIG. 19 shows an example of an ANN 1901. ANN 1901 can include an input layer, an output layer, and one or more hidden layers. Hidden layers and the output layer can include one or more artificial neurons. In the example shown, the hidden layer includes three neurons (H1, H2, H3) and the output layer includes one neuron (OUT).

A neuron can execute MAC operations on input values to generate an output value, which can be passed on to a next layer, or as an output for the ANN. Neurons can also include additional operations, such as activation functions and/or filtering/pooling. Such MAC operations involve the application of weight values to input values (which can correspond to a multiply operation) and the summation of the resulting products (which can correspond to an accumulation operation).

In a training operation, ANN 1901 can have an initial set of weight values, which can be revised as training input data sets are applied and resulting output values are generated and evaluated. Once trained, weight value can be essentially set, and an ANN 1901 can execute inference operations, generating predicted output values from new input data sets.

In FIG. 19, weight values for hidden layer neurons are shown as Wi,j, where i=1-3 and j=1-3. Thus, neuron H1 will multiply value X1 by weight W11, X2 by weight W21, X3 by weight W31, and X4 by weight W41. Such products will be summed (and possibly subject to other operations), and the result output from neuron H1 and provided as an input to neuron OUT. Neuron OUT will multiply the output from H1 by weight W1. The operation of the other neurons of FIG. 19 is understood from this description.

In many applications, neuron operations can be represented by matrix multiplication. FIG. 20A shows an example of such matrix multiplication. Vector V (with components Vi (i=1-3)) can correspond to input values, operation vector G (with components $(G_{i,j})$ (j=1-3)) can correspond to weight values, and vector Ii, can correspond to a resulting output value.

One conventional way of implementing the vector operation shown in FIG. 20A can be with a crossbar memory array. FIG. 20B shows a conventional crossbar memory array 2003. Crossbar memory array 2003 can include memory elements $(G_{i,j})$, represented by resistances, arranged into rows and columns. Memory elements of a same row can be connected to a same word line, while memory elements of a same column can be connected to a same bit line. For example, memory elements $G_{1,1}$, $G_{1,2}$ and $G_{1,3}$ can be connected to a same word line (which receives voltage $V_1$). Columns of crossbar memory array 2003 can be connected to a same bit line. For example, memory elements $G_{1,1}$, $G_{2,1}$ and $G_{3,1}$ can be connected to a same bit line (which can provide current $I_1$).

In operation, word lines can be driven with input value voltages (V1, V2, V3), resulting in the generation of currents on bit lines, which can represent a MAC result. For example, if memory element weights $(G_{i,j})$ are a conductance, a current $I_1$ can be the summation of $V_i * G_{i,1}$. The weight terms for a given summation operation can be considered a "kernel". FIG. 20B thus shows three column-wise kernels: $G_{i,1}$; $G_{i,2}$ and $G_{i,3}$.

FIG. 21 shows a conventional "compute-in-memory" (CIM) array 2103 for executing MAC operations like those shown in FIG. 20B. CIM array 2103 can include memory cells (two shown as 2105-0/1) arranged into rows and columns. All memory cells can be commonly connected to a source line (SL), which can be driven by a source line driver 2107. Column pairs (one shown as 2109) can be programmed to store kernels (three shown as 2111-0 to -2). Memory cells of one column of a pair can store positive components (+ve) of kernel, while the other column of the pair can store negative components (−ve) of a kernel.

FIG. 21 shows CIM array 2103 configured to execute CAM operations for a neural network like that of FIG. 19. Column pairs can provide current values representing results for hidden layer neurons (H1, H2, H3).

In a compute operation, SL driver 2107 can drive a common SL to a predetermined voltage. Row drivers (one shown as 2113) can activate rows based on input values X1-X3 (X4 not shown). When a row is activated, its memory cells can generate a current on the corresponding bit line that varies according to the programmed weight value. As multiple memory cells are connected to the same bit line, a bit line can generate a summation of currents from the activated memory cells of the column.

Summation currents generated on a column can be provided to a multiplexer (MUX) (one shown as 2115). The MUX 2115 can sequentially connect bit line pairs to an integrator (one shown as 2117), which can integrate the current. The integrated value can then be converted to a digital value by an analog-to-digital converter (ADC) circuit 2119.

FIG. 22 is a schematic diagram showing a portion of the CIM array 2203 of FIG. 21. Each memory cell (one shown as 2205-0) can include a select transistor M221 and a silicon-oxide-nitride-oxide-silicon (SONOS) type transistor M223. SONOS type transistor can have a charge trapping gate insulator layer that can be programmed to a multi-level or analog threshold voltage (Vt) or drain current (ID) of the SONOS type transistor. The programmable Vt or ID can establish the weight value for the memory cell. Memory cells of one column 2221-0 can store positive weight components (+ve), and thus generate a positive weight MAC result for a kernel, while memory cells of the other column 2221-1 can store negative components (−ve), and thus generate a negative weight MAC result for a kernel. A final MAC output for a column pair can be generated by converting positive and negative MAC results into digital values and then subtracting, or oppositely integrating such values and then converting the result to a digital value.

It is noted that to accommodate negative input values, a conventional CIM array 2203 requires four columns per input value. One column pair would be dedicated to a positive input value, while the other, with oppositely programmed weights, would be dedicated to a negative input value.

A conventional CIM array like that of FIGS. 21 and 22 can generate MAC results in a highly parallel fashion. In one embodiment of the CIM arrays, MAC result throughput can be limited. Because integrator and ADC circuits (e.g., 2117, 2119) consume large amounts of substrate area, a MUX 2115 must switch between a large number of bit lines for ADC circuits to sequentially generate MAC results. In addition, processing of positive and negative weight results can consume power when both values are converted to digital results and the negative weight results subtracted from one another.

Another characteristic can be relatively low write/refresh cycle time. The nonvolatile memory cells can require values to be re-programmed over time. Further, kernel values may have to be updated periodically. Such cases can require multiple rows to be re-programmed, with programming operations to one cell risking a disturb results in adjacent cells.

It would be desirable to arrive at a CIM array and systems utilizing such SONOS or similar based memory arrays, that may address the above-mentioned potential issues.

BRIEF DESCRIPTION OF THE DRAWINGS

FIG. 4 is a table showing bit line voltage levels for signed input values according to embodiments.

FIGS. 5A and 5B are schematic diagrams showing the application of positive and negative input values to a NVM cell pair according to an embodiment.

FIG. 21 is a schematic diagram of a conventional CIM device.

DETAILED DESCRIPTION

Figure 1:
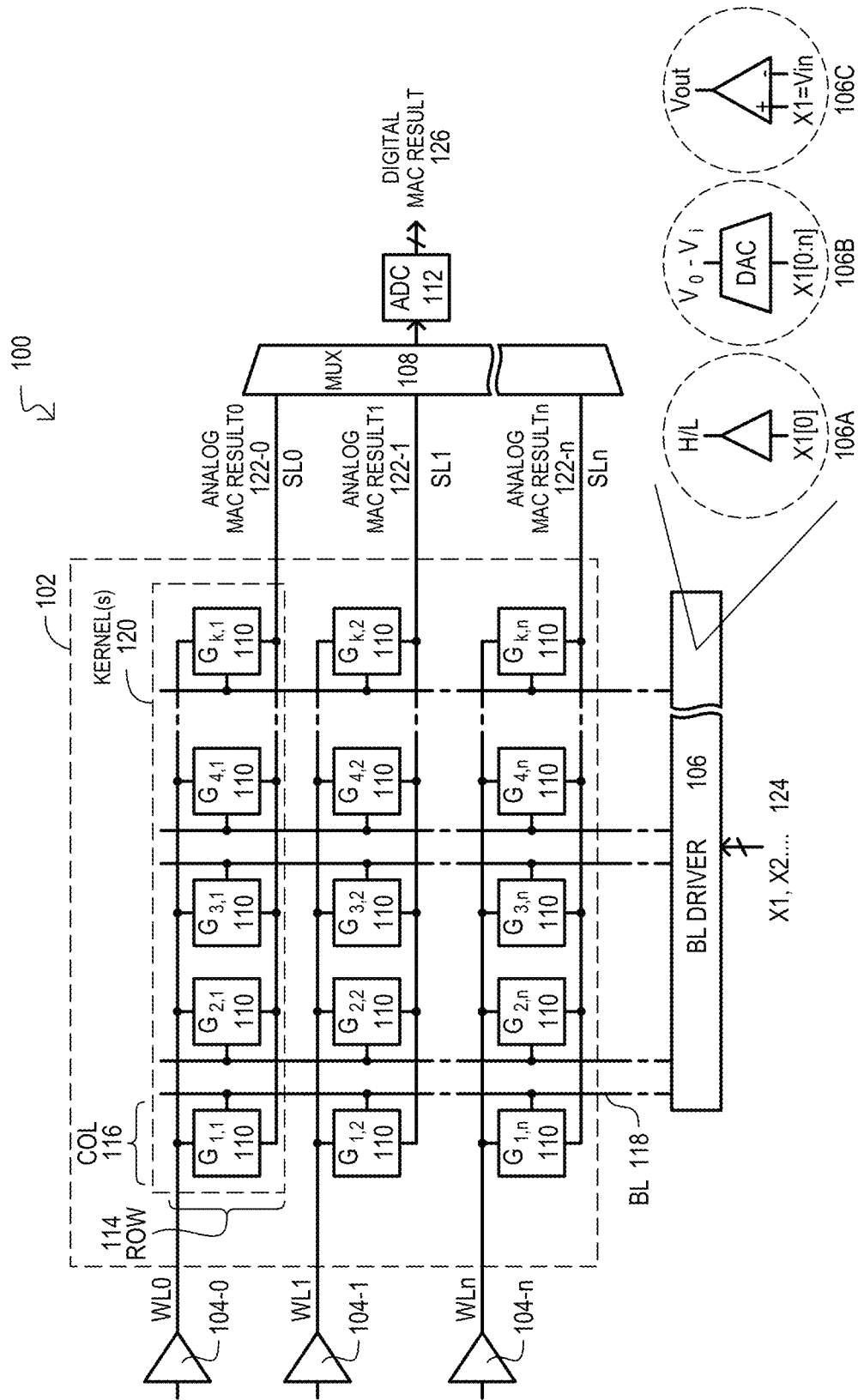
FIG. 1 is a schematic diagram of a compute-in-memory (CIM) device according to an embodiment.

According to embodiments, multiply-accumulate (MAC) results can be generated by storing sets of multiplier values (e.g., weights) in memory cell rows of a compute-in-memory (CIM) array. Multiplicand values (e.g., input values) can be applied in a column wise fashion to the CIM array. In response to multiplicand values, memory cells can generate a cell current or voltage that varies according to the stored weight values. Cell currents or voltages can be accumulated as analog MAC values on a conductive line (e.g., source line) common to each row. Analog MAC values from each row can be multiplexed to an analog-to-digital converter (ADC) to generate a digital MAC value.

According to embodiments, MAC results from CIM arrays can include operations of artificial neurons. CIM arrays can be connected to one another with a programmable switch fabric to form an artificial neural network.

According to embodiments, multiplicand (input) values can be signed. For an input value of one sign, a bit line can be driven to one voltage (e.g., positive). For an input value of another sign, the bit line can be driven to another voltage (e.g., zero or negative). In some embodiments, weight values are stored as pairs, with positive weights (+ve) being stored in one memory cell and negative weights (-ve) being stored in an adjacent memory cell. For a positive input value, the corresponding bit line pair can be driven to different values (e.g., $BL0=V_{HI}$, $BL1=V_{LOW}$). For a negative input value, the corresponding bit line pair can be driven to opposite values (e.g., $BL0=V_{LOW}$, $BL1=V_{HI}$).

According to embodiments, the conductive lines that accumulate MAC results (e.g., source lines) can have a lower resistance than the bit lines.

According to embodiments, memory cells can be narrower in the row direction than the column direction. That is, memory cells can have a row height greater than a column width. In some embodiments, a memory cell height (i.e., the cell dimension in the column direction) can be no less than three times the memory cell width (i.e., the cell dimension in the row direction).

According to embodiments, in a MAC operation, bit lines can be driven according to an input value. Word line driver circuits can activate word lines of one or more rows of a CIM array. An activated word line can connect a programmable element of each memory cell in the row to a corresponding bit line. A potential difference between a bit line and source line can generate a current through the memory cell that varies according to the programmable element. As a source line can be connected to one per row, a resulting current on the source line can be an accumulation of all currents generated by the memory cell of the row.

According to embodiments, a CIM array can be a nonvolatile memory array, with weight values being stored in nonvolatile fashion. In some embodiments, memory cells can include an insulated gate field effect transistor (IGFET) structure having a programmable threshold voltage. In some embodiments, memory cells can be two transistor memory cells, having a select transistor and a programmable transistor.

In the various embodiments below, like items are referred to by the same reference characters, but with the leading digit(s) corresponding to the figure number.

FIG. 1 is a block diagram of a CIM device 100 according to an embodiment. A CIM device 100 can include a non-volatile memory (NVM) cell array 102, word line drivers 104-0 to -n, bit line driver 106, a source line multiplexer (MUX) section 108, and ADC section 112. A NVM cell array 102 can include NVM cells 110 arranged into rows (one shown as 114) and columns (one shown as 116). NVM cells 110 of a same column can be connected to a same bit line (one shown as 118). NVM cells 110 of a same row can be connected to a same word line WL0-WLn (or set of word lines) and same source line SL0-SLn. Unlike conventional approaches, source lines (SL0-SLn) are not commonly connected, but rather separate from one another. In one embodiment, NVM cells may be silicon-oxide-nitride-oxide-silicon (SONOS) based charge-trapping memory cells capable of being programmed and retaining charges to represent multiple (more than two) states or levels. In other embodiments, NVM cells may be other multi-level memory cells, such as floating gate, R-RAM, etc.

NVM cells 110 can be programmed to a predetermined multi-level current or voltage (e.g., drain current or threshold voltage) to the corresponding source line (SL0-SLn) when selected. Such current or voltage is represented by $G_{i,j}$, where i=1 to k, and j=1 to n. In some embodiments, NVM cells 110 can be programmed to store sets of multiplier terms (e.g., kernels) for MAC operations. However, in contrast to conventional approaches, such sets (one represented by 120) can be stored in a row-wise fashion and not a column-wise fashion. According to embodiments, NVM cells 110 can be programmed between at least three different states or analog levels, to provide or represent different analog weight values. That is, NVM cells 110 are not programmed with binary values.

Word line drivers (104-0 to -n) can drive one or more word lines for each row 114 to select the NVM cells 110 of the row. In some embodiments, such as in a two-transistor (2T) configuration or 1.5T (split gate) configuration, there can be more than one word line per row 114 (e.g., a select gate word line and control gate word line), and such different word lines can be driven separately according to mode of operation. However, in other embodiments there can be one word line per row 114. Bit line driver 106 can drive bit lines 118 according to input (e.g., multiplicand) values (X1, X2 . . . ) 124. Different bit lines can represent different input terms. In some embodiments, bit lines 118 can be driven between two different voltages (i.e., input terms can be binary values). In other embodiments, bit lines 118 can be driven between more than two different states or driven to an analog value. Accordingly, a bit line driver 106 can include any of: digital driver circuits 106A, multi-bit driver circuits 106B or analog driver circuits 106C. Digital driver circuits 106A can drive a bit line between two voltage levels in response to a binary input value X1[0]. Multi-bit driver circuit 106B can drive a bit line between three or more levels. In some embodiments, a bit line driver 106B can include a digital-to-analog converter (DAC), that can generate different output voltages (V0 to $V_i$) in response to a multi-bit input value X1[0:n] (where n≥1). Analog driver circuits 106C can drive a bit line to an analog voltage Vout in response to an analog input voltage Vin, which may or may not be the same as Vout.

MUX section 108 can include one or more MUXs for selectively connecting source lines (SL0 to SLn) to ADC section 112. ADC section 112 can convert a voltage or current on a selected source line (SL0-SLn) into a digital value.

Having described the general sections of a CIM device 100, MAC operations will now be described. Kernels (e.g., 120) can be stored in rows of NVM cell array 102. Input values 124 can be driven on bit lines by BL driver 106. Row drivers (104-0 to -n) can drive a word line (WL0 to -n). In response, a current path can be enabled through the NVM cells 110 of the selected row, between each bit line 118 and the source line (SL0 to SLn) for the row. Such cell currents are thus summed on the source line as an analog MAC result (122-0 to -n).

MUX section 108 can connect the source line (SL0 to SLn) to the ADC section 112. The ADC section 122 can convert the selected analog MAC result (122-0 to -n) into a digital MAC result 126. Such an operation can be repeated to generate MAC results (122-0 to -n) for each row in response to a same set of input values on bit lines 118.

A CIM device 100 can have various features that differ from conventional approaches. According to embodiments, NVM cell array 102 can store kernels in rows, as opposed to columns. Input values can be applied via bit lines, rather than word lines. Further, NVM cell array 102 can have source lines (SL0 to SLn) dedicated to each row, rather than unified source lines as in the conventional case. MAC results can be summed on source lines, and not bit lines. Similarly, rows (e.g., source lines) can be MUXed to ADC circuits as opposed to columns (e.g., bit lines).

In some embodiments, bit line driver 106 can provide inputs for neurons and kernels 120 can be weight values for such neuron inputs. Each analog MAC result (122-0 to -n) can correspond to a different neuron in response to a same input value set (e.g., neurons of a same hidden layer).

Embodiments can include memory cells of any suitable type that can be programmed between more than two states, where each different state can provide a different current or voltage response. FIGS. 2A to 2E are diagram showing examples of NVM cells that can be included in embodiments.

Figure 2A:
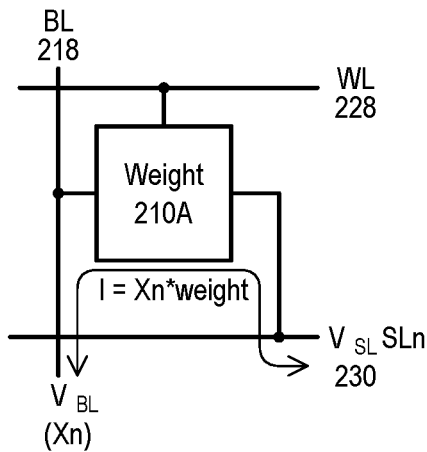
FIGS. 2A to 2E are diagram showing nonvolatile memory (NVM) cells that can be included in CIM arrays according to embodiments.

FIG. 2A is a block diagram of a memory cell 210A that can be included in CIM arrays according to embodiments. A memory cell 210A can be connected to a bit line 218, a word line 228 and a source line 230. Memory cell 210A can be programmed with a weight value, which can dictate the magnitude of a current flow through the memory cell 210A. In response to a voltage on word line 228, a conductive path can be enabled between bit line 218 and source line 230. Bit line 218 can be at a voltage $V_{BL}$ which can vary according to an input value Xn. Source line 230 can be at a source line potential $V_{SL}$. A current (I) flowing through the memory cell 210A can vary according to the stored weight value, and in some embodiments I=Xn*Weight. A direction of current I can vary according to the values of $V_{BL}$ and $V_{SL}$.

Figure 2B:
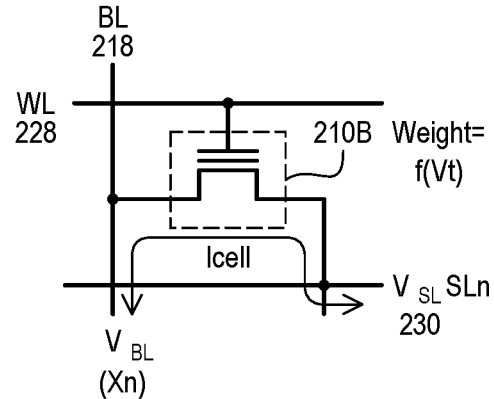

FIG. 2B is a schematic diagram of one transistor (1T) cell 210B that can be included in CIM arrays according to embodiments. A 1T cell 210B can have an IGFET structure with a threshold voltage (Vt) programmable between no less than three values. A threshold voltage (Vt) can be established with any suitable structure, including a floating gate or other charge trapping mechanism, such as a SONOS type device. A SONOS type device can include silicon substrate, ONO gate dielectric, and silicon (e.g., polysilicon gate), however a SONOS type device can also be subject to variation in gate types, substrate types, and gate dielectric structures. A 1T cell 210B can be selected as described for the cell of FIG. 2A. A resulting cell current Icell can vary according to the programmed Vt.

Figure 2C:
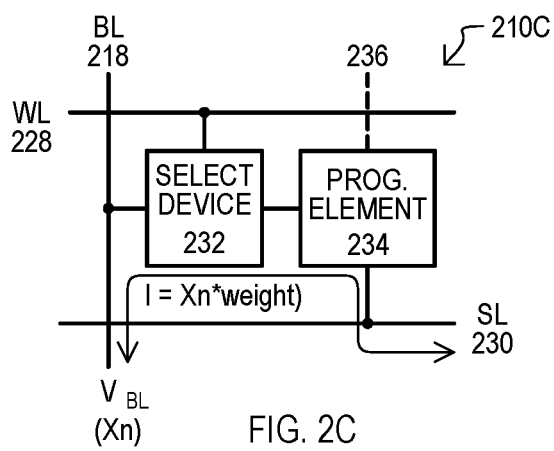

FIG. 2C shows a two-device memory cell 210C that can be included in CIM arrays according to embodiments.

Memory cell 210C can include an access device 232 and a programmable element 234. In response to a voltage on a word line 228, select device 232 can enable a conductive path between bit line 218 and programmable element 234. A programmable element 234 can be programmed between three or more weight values. In some embodiments, programmable element 234 can be connected to one or more other nodes (shown as 236) to enable the programmable element and/or to program a weight value into programmable element. A resulting current can vary according to the weight value programmed in the programmable element. A programmable element can be a two-terminal device or a three-terminal device.

Figure 2D:
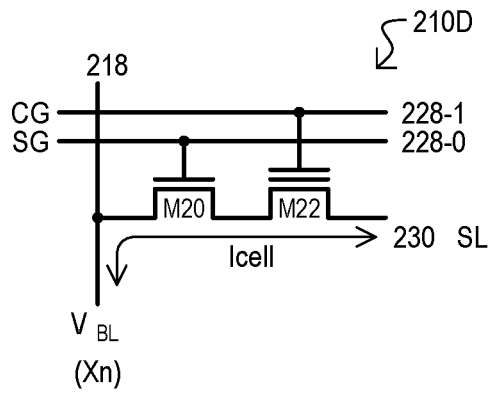

FIG. 2D shows a two-transistor (2T) memory cell 210D that can be included in CIM arrays according to embodiments. Memory cell 210D can include a select transistor M20 and a programmable transistor M22. Select transistor M20 can be enabled by a voltage on a select gate (SG) word line 228-0 to provide a current path between bit line 218 programmable transistor M22. Programmable transistor M22 can have a programmable Vt as described herein and equivalents. In some embodiments, programmable transistor can be a SONOS type device. In some embodiments, in a current generating (e.g., MAC) operation, a control gate 228-1 can be biased to generate the desired weighted current (Icell). While FIG. 2D shows transistors of n-type conductivity, alternate embodiments can include transistors of p-type conductivity, as well as enhancement or depletion mode transistors.

Figure 2E:
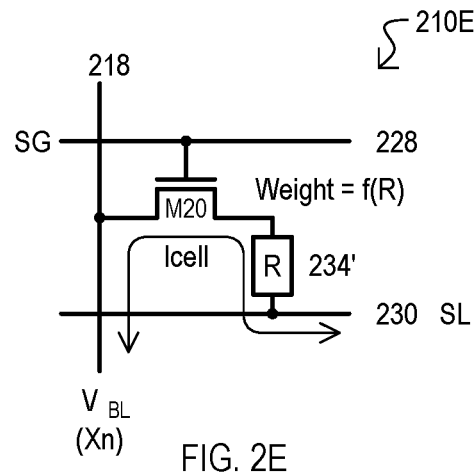

FIG. 2E shows another 1T memory cell 210E that can be included in CIM arrays according to embodiments. Memory cell 210E can include a select transistor M20 and a programmable element 234'. Select transistor M20 can be enabled by a voltage on a select gate (SG) word line 228 to provide a current path between bit line 218 programmable element 234'. Programmable element 234' can be programmed between three or more resistance states. Programmable element 234' can take any suitable form, including but not limited: to a ferroelectric random access memory (FRAM) element, magnetoresistive RAM (MRAM) elements, phase change RAM (PCM) elements, or resistive RAM (RRAM) elements.

Figure 3:
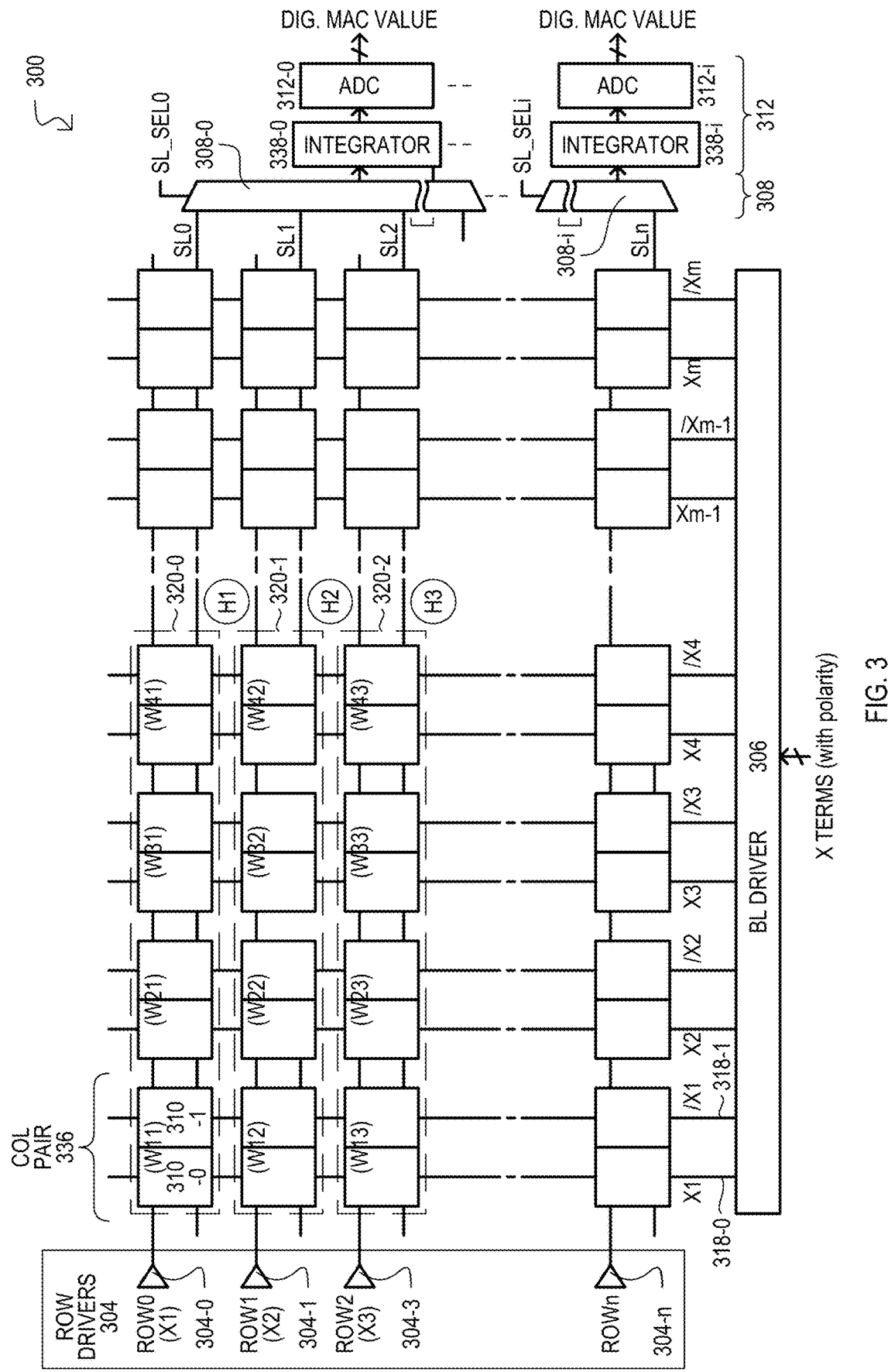
FIG. 3 is a schematic diagram of a CIM device according to another embodiment.

FIG. 3 is a block diagram of a CIM device 300 according to another embodiment. In some embodiments, CIM device 300 can be one implementation of that shown in FIG. 1. A CIM device 300 can include items like those of FIG. 1, and such like items can operate in a same or similar fashion.

In FIG. 3, weight values can have positive components and negative components. Positive and negative weight value are stored in adjacent memory cells (two shown as 310-0/1) of a column pairs (one shown as 336). For example, memory cell 310-0 can store a positive component (+ve) of weight W11, while memory cell 310-1 can store a negative weight component (−ve) of weight W11 (or vice versa).

According to embodiments, a CIM device 300 can store sets of weight values in rows. In addition, weight values can be programmable by rows. This is in contrast to conventional approaches, which can store sets of weight values in columns. By storing weight values in rows, embodiments can update weight value sets faster and with less disturb possibilities as compared to conventional devices. Rather that program multiple rows to update one set of weight values, embodiments can program a single row.

Bit line driver circuits 306 can drive bit lines of a column pair 336 between different voltages. Such a feature can enable input values to have a polarity. In some embodiments, if an input value is positive (e.g., X1), one bit line 318-0 can be driven to a first voltage while the other bit line 318-1 is driven to a second voltage. However, if an input value is negative (e.g., −X1), one bit line 318-0 can be driven to the second voltage while the other bit line 318-1 is driven to the first voltage. This is in contrast to conventional approaches that may have to store negative versions of weight values in a second column. In some embodiments, bit line driver circuits 306 can deselect a column pair, by driving both columns to a deselect voltage. A deselect voltage can be a voltage that will generate essentially no current in the memory cells selected by a word line.

In operation, sets of rows can be connected to MUXs 308-0 to 308-i with corresponding source lines SL0 to SLn. Each MUX (308-0 to 308-i) can connect a source line (SL0 to SLn) to ADC circuits in response to select signals SL_SEL0 to -i. An analog current on the selected source line (SL0 to SLn) can be integrated by a corresponding integrator 338-0 to -i. The integrated charge can be converted into a digital value (DIG. MAC VALUE) by a corresponding ADC circuit 312-0 to -i.

In some embodiments, memory cells can be longer in the column direction than in the row direction. In a conventional device, MUXs can have inputs connected to columns, and extend in the row direction. In contrast, according to embodiments, MUXs can have inputs connected to rows and extend in the column direction. As a result, MUXs can have more area per input than a conventional device.

FIG. 3 shows kernels (weights sets) 320-0 to 320-2 arranged into rows. Kernel 320-0 includes memory cells that store weights W11, W21, W31 and W41. With the applications of input values X1-X4, a current can be generated on a source line SL0 corresponding to a MAC result (X1*W11+X2*W21+X3*W31+X4*W41), which can be a summation operation for a neuron (H1). Kernels 320-1/2 provide similar results on source lines SL1 and SL2, respectively. Such an arrangement can enable kernels to be updated with single row programming operations. This is in contrast to conventional approaches that store kernels a column direction, requiring the programming of multiple rows to update a kernel, introducing the possibility of disturbing the states of other memory cells, as well as increasing a wear rate for the memory cell array.

FIG. 4 is a table showing bit line voltages for providing signed input values according to an embodiment. FIG. 4 shows voltages for a bit line pair ($V_{BL+}$, $V_{BL-}$). For an input value having a positive polarity (Xj(pos)), a first bit line voltage ($V_{BL+}$) can be relatively higher (H) than a second bit line voltage ($V_{BL-}$=L). Conversely, for an input value having a negative (Xj(neg)), $V_{BL+}$=L and $V_{BL-}$=H. In some embodiments, a column pair can be deselected by driving a bit line pair to a deselect voltage, which in some embodiments can be a source line voltage ($V_{SL}$).

FIGS. 5A and 5B are diagrams showing memory cell pair operations for positive and negative inputs. FIGS. 5A and 5B show memory cells 510-0/1 that each include a select transistor M51/M52 and a programmable transistor M50/M53. Programmable transistor M50 of memory cell 510-0 can be programmed to store a positive weight value (ve+) while programmable transistor M53 of memory cell 510-1 can be programmed to store a negative weight value (ve−). Each select transistor M51/M52 can have a drain connected to a corresponding bit line 518-0/1, a gate connected to a select word line 540-1 and sources connected to the drain of the corresponding programmable transistor M50/M53. Each programmable transistor M50/M53 can have a gate connected to a program word line 540-0 and sources connected to a source line 542. Referring to FIG. 5A, when an input value Xj is positive, bit line 518-0 can be driven to $V_{BL+}$, while bit line 518-1 can be driven to $V_{BL-}$. Select word line 540-1 can be driven to a potential that turns on select transistors M51/M52 enabling a current to flow through the select transistor M51/M52 that varies according to a programmed state of the corresponding programmable transistor M50/M53. In some embodiments this can also include biasing program word line 540-0. A bit line voltage $V_{BL+}$ can be greater than a source line voltage $V_{SL}$, thus a positive weight current component Ive+ can flow through the memory cell 510-0 from the bit line 518-0 to the source line 542. A bit line voltage $V_{BL-}$ can be less than a source line voltage $V_{SL}$, thus a negative weight current component Ive− can flow through the memory cell 510-1 from the source line 542 to the bit line 518-1.

Referring to FIG. 5B, when an input value Xj is negative, bit line 518-0 can be driven to $V_{BL-}$, while bit line 518-1 can be driven to $V_{BL+}$. Consequently, weight current components Ive+, IVe− can flow in the opposite direction to that of FIG. 5A.

In some embodiments, memory cell pair 510-0/1 can be selected together, with current components Ive+, Ive− acting against one another at the corresponding source line 542. However, in other embodiments, a MAC generation operation can be a two-step process, with one set of current components being selected while the other set is deselected. For example, in a first step, a bit line 518-0 could be driven to $V_{BL+}$ (or $V_{BL-}$), while bit line 518-1 is driven to $V_{SL}$. A source line 542 can thus generate positive weight currents. In a second step, the other bit line 518-1 could be driven to $V_{BL+}$ (or $V_{BL-}$), while bit line 518-0 is driven to $V_{SL}$. A source line 542 can thus generate negative weight currents.

Figure 6:
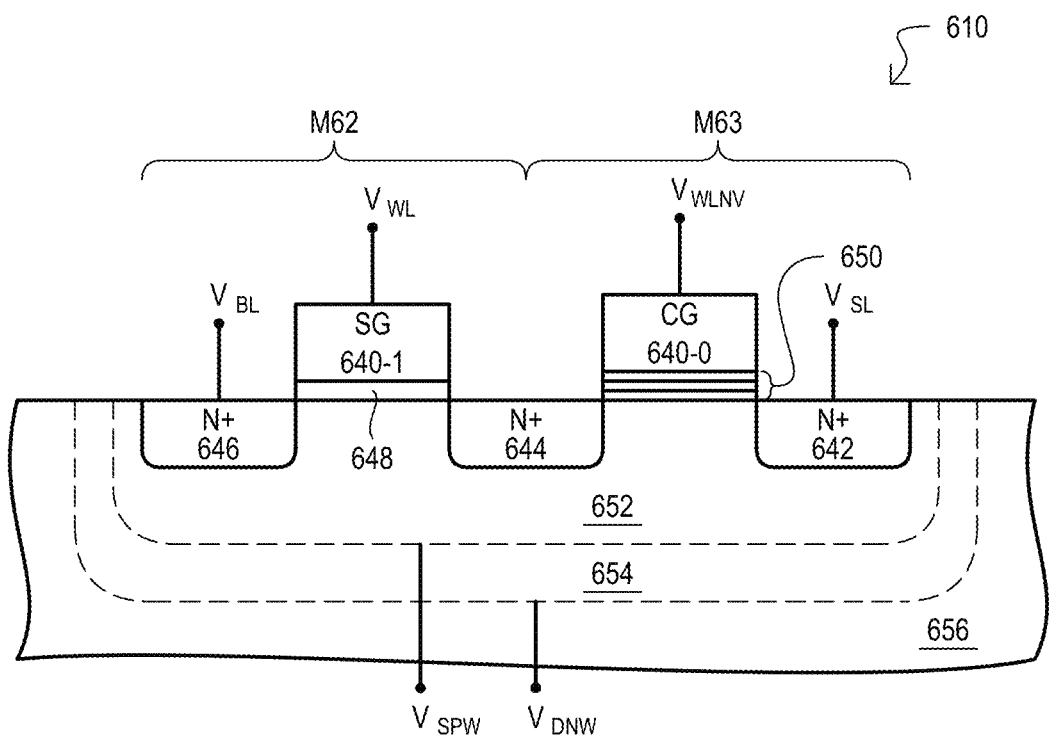
FIG. 6 is a side cross sectional view of a NVM cell that can be included in embodiments.

FIG. 6 is a cross sectional diagram of a memory cell 610 that can be included in embodiments. A memory cell 610 can include a select transistor M62 and a programmable transistor M63 formed with a substrate 656. Select transistor M62 can have a drain 646 connected to receive a bit line voltage $V_{BL}$, a select gate (SG) connected to, or formed as part of a select word line 640-1, and a diffusion 644 serving as a source. A select gate SG can be formed over a gate dielectric 648. Select gate (SG) can be driven to a voltage $V_{WL}$, which can vary according to operations.

Programmable transistor M63 can have a drain from diffusion 644, a control gate (CG) connected to, or formed as part of a program word line 640-0, and a source connected to, or formed as part of a source line 642. A control gate (CG) can be formed over a charge storage gate dielectric 650, which in some embodiments can include a layer of silicon nitride formed between layers of silicon oxide (i.e., ONO). Programmable transistor M63 can have a SONOS type structure. A control gate (CG) can be driven to a voltage $V_{WLNV}$, which can vary according to operation. In some embodiments, a magnitude and/or number of pulses for $V_{WLNV}$ can be used to program a weight value into programmable transistor. Source line 642 can be driven to a voltage $V_{SL}$, which can also vary according to operation.

In the embodiment shown, select and programmable transistors M62/M63 can be n-channel devices. However, alternate embodiments can include different conductivity type transistors. Select and programmable transistors (M62/M63) can have insulated gate field effect transistor type structures. However, alternate embodiments can have different transistor structure types.

Select and programmable transistors M62/M63 can be formed in a first region 652, which in some embodiments can be a well doped to an opposite conductivity type to source/drains of M62/M63 (e.g., p-type well). According to embodiments, first region 652 can be driven to a voltage $V_{SPW}$, which can vary according to operation. In the embodiment shown, first region 652 may itself be contained in a second region 654. In some embodiments, a second region 654 can be a deep well doped to an opposite conductivity type to first region 652. Such an arrangement can enable first region 652 to be biased to voltages outside of a power supply voltage for a device. For example, first region 652 can be driven to a negative voltage to erase and/or program programmable transistor M63 to store a weight value.

Figure 7:
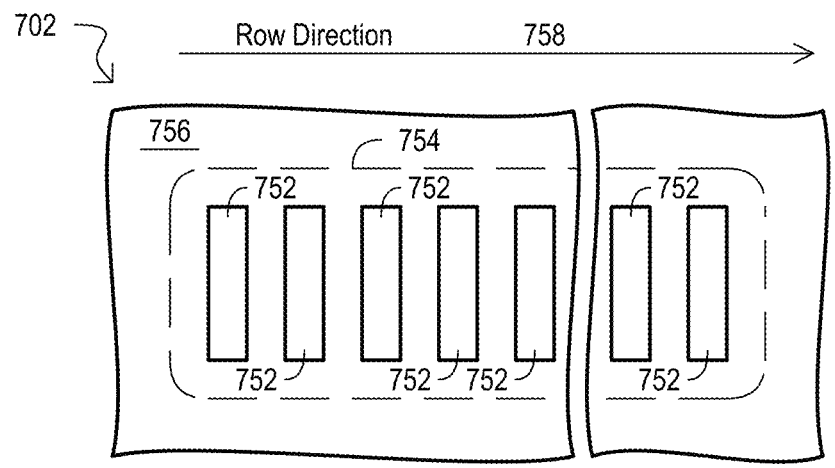
FIG. 7 is a top plan view of a row of NVM cells that can be included in embodiments.

FIG. 7 is a top plan view of a portion of an NVM cell array 702 that can be included in embodiments. FIG. 7 shows memory cell regions 752 formed in a substrate 756. Memory cell regions 752 can each correspond to a memory cell of a NVM array in a CIM device. Memory cell regions 752 can be disposed in a row direction 758 (e.g., parallel to word lines and essentially perpendicular to bit lines). As shown, a row of memory cell regions 752 can be formed within second region 754. Such an arrangement can enable a substrate for a row of memory cells to be driven to program/erase bias voltages, without having to drive other rows. This can advantageously enable erasing and programming of memory cell rows with little or no risk of disturbing memory cells outside of the row being programmed.

Figure 8:
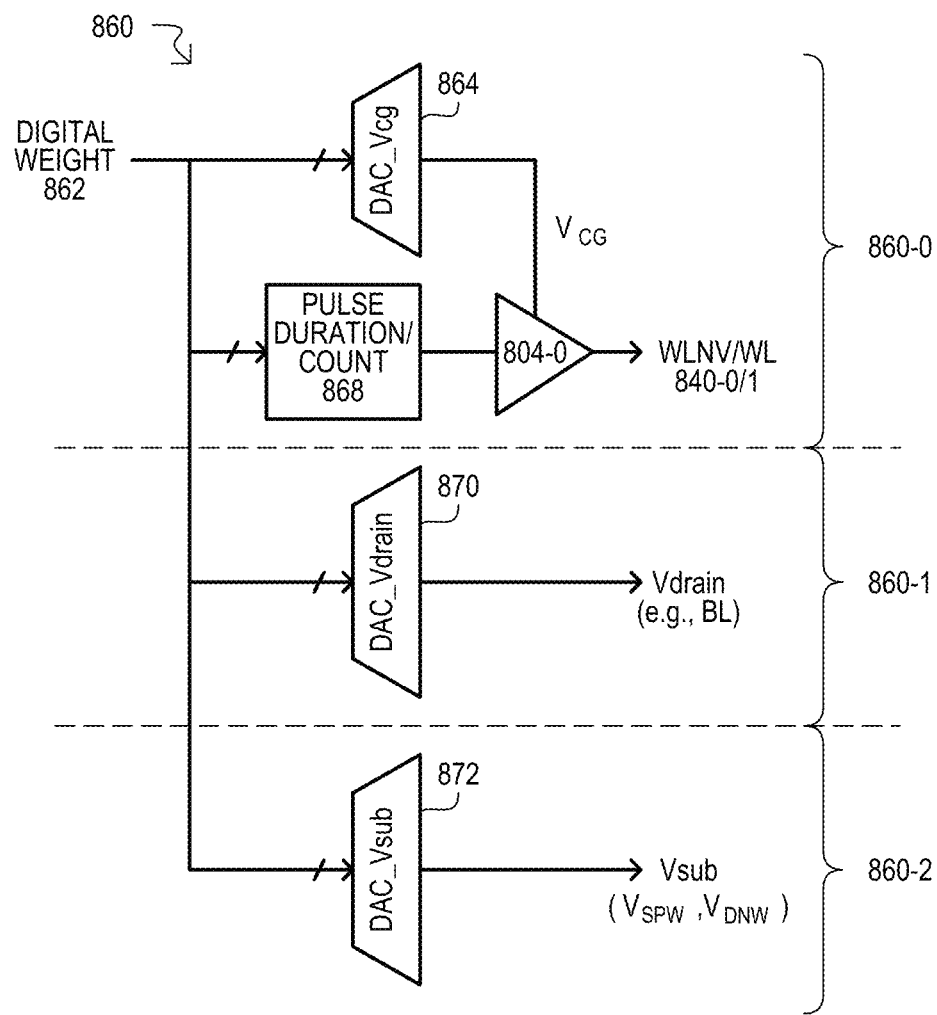
FIG. 8 is a diagram of programming circuits that can be included in embodiments.

FIG. 8 is a block diagram showing various programming circuits that can be included in embodiments. Programming circuits can apply conditions to memory cells that results in a current response equivalent to a multiplication operation. While memory cells can take any suitable form, FIG. 8 shows circuits that can be included for programmable transistors.

Section 860-0 shows a word line driver circuit that can apply word line (e.g., control gate) conditions to establish a threshold voltage of a programmable transistor. A digital-to-analog converter (DAC) 864 can generate a control gate voltage $V_{CG}$ in response to a digital weight value. Word line driver 804-0 can drive one or more word lines (840-0/1) with the control gate voltage $V_{CG}$. In addition or alternatively, a pulse generator 868 can alter a number and/or duration of voltage pulses based on the digital weight value 862. Word line driver 804-0 can drive one or more word lines (840-0/1) based on such pulses.

Section 860-1 shows a bit line voltage generator that can be included in embodiments. A DAC 870 can generate a drain voltage Vdrain in response to a digital weight value 862. The drain voltage (Vdrain) can be driven on a bit line. In some embodiments, a drain voltage (Vdrain) can be pulsed, have a number of pulses and/or a pulse duration that varies in response to digital weight value 862.

Section 860-2 shows a substrate voltage generator that can be included in embodiments. A DAC 872 can generate a substrate voltage ($V_{SPW}$, $V_{DNW}$) in response to a digital weight value 862. A DAC 872 can generate more than one substrate voltage. Further, such substrate voltages can vary in polarity.

Embodiments can include a NVM cell array for a CIM device having source lines that extend in the row direction (i.e., parallel to word lines). Further, each source line can be connected to only one row of memory cells. Bit lines can extend essentially perpendicular to the source lines.

Figure 9:
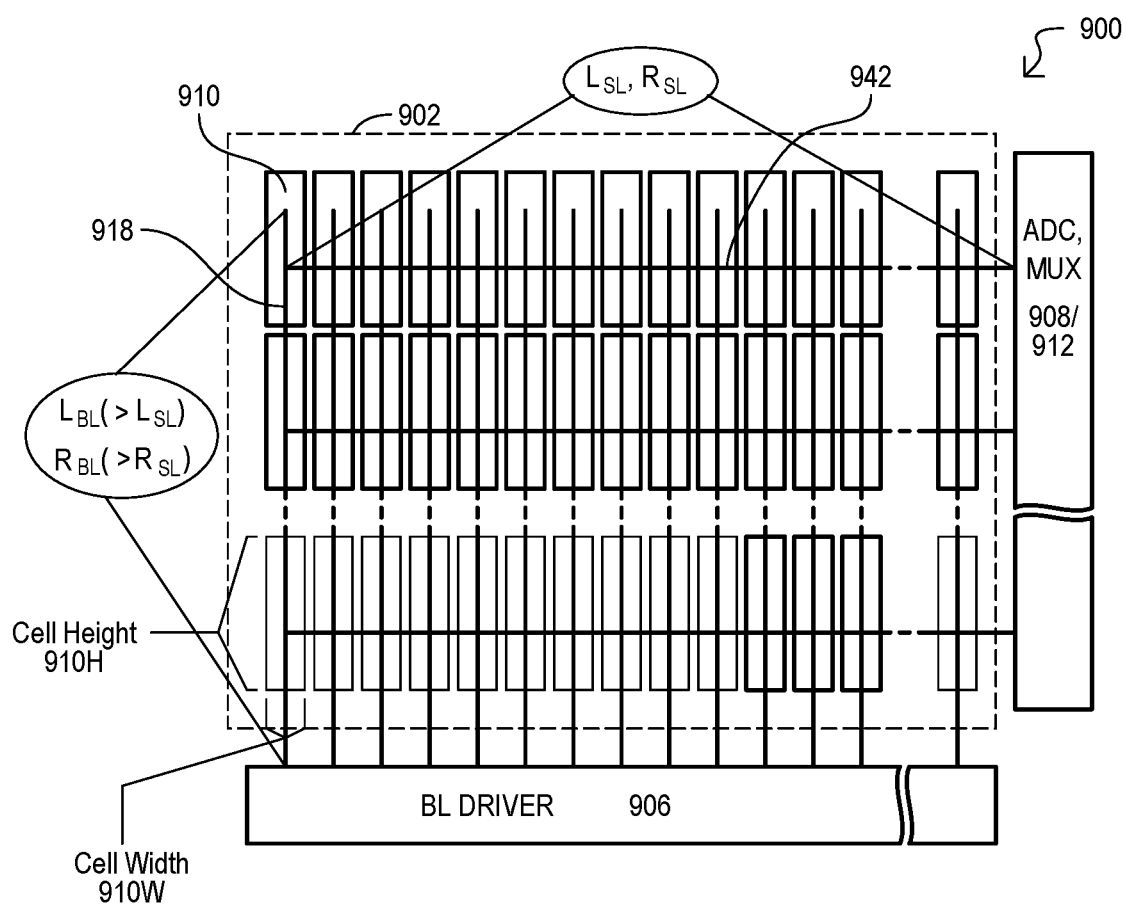
FIG. 9 is top plan view of a CIM device according to an embodiment.

FIG. 9 is a top plan view of a CIM device 900 according to an embodiment. CIM can include NVM cell array 902 having rows connected to ADC-MUX circuits 908/912 and columns connected to bit line driver 906. NVM cell array 902 can include memory cells (one shown as 910) having a cell height 910H that is greater than cell width 910W. Each row of memory cells can be connected to a source line (one shown as 942). Each column of memory cells can be connected to a bit line (one shown as 918).

A bit line 918 can have a bit line resistance $R_{BL}$ and a source line 942 can have a source line resistance $R_{SL}$. According to embodiments, $R_{BL} > R_{SL}$. Such an arrangement can allow for greater dynamic sensing range for an integrator stage in ADC conversions as compared to conventional cases in which MAC results are provided on bit lines. In some embodiments, a bit line 518 can have a length bit $L_{BL}$ and a source line 942 can have a $L_{SL}$, with $L_{BL} > L_{SL}$.

Figure 10:
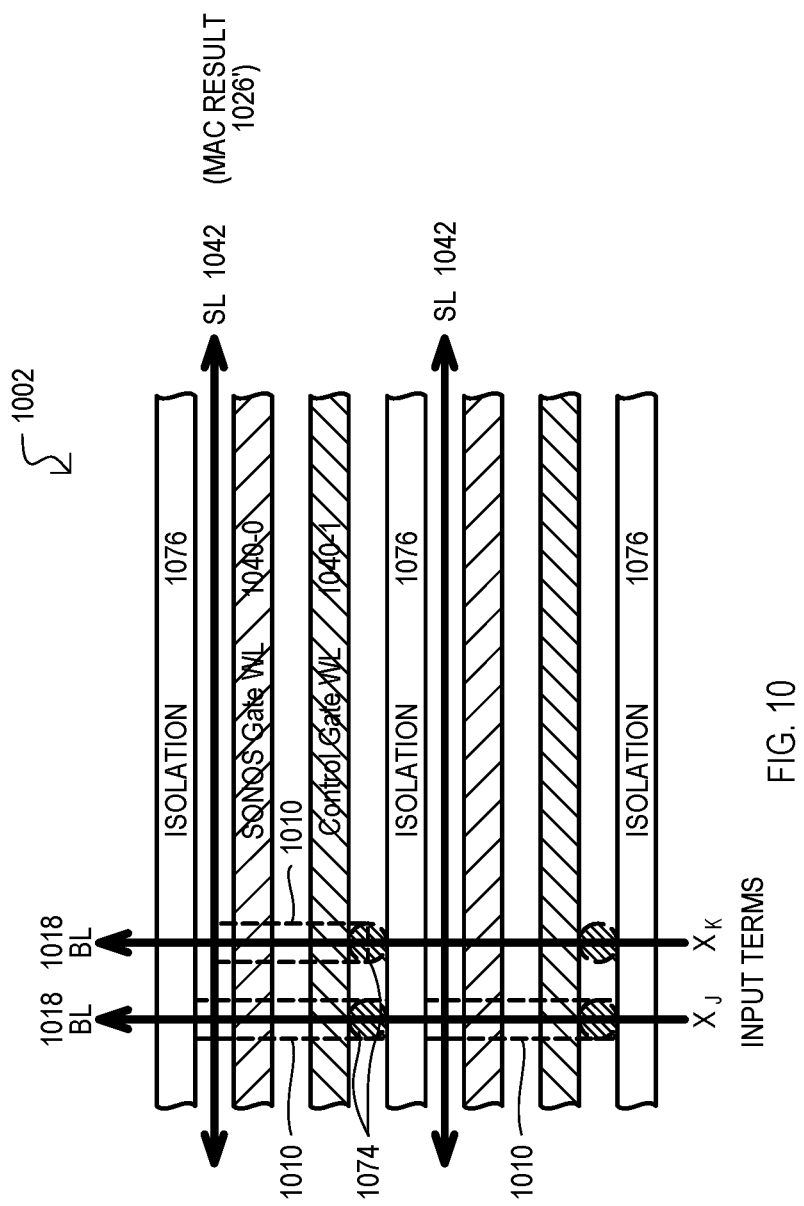
FIG. 10 is a top plan view of a CIM array according to an embodiment.

FIG. 10 is a top plan view of a portion of a NVM array 1002 that can be included in embodiments. NVM array 1002 can include memory cells (three shown as 1010) arranged into rows and columns. Memory cells 1010 can be 2T type memory cells, including a select transistor and a SONOS type transistor. Memory cells of a same row can be connected to a same control gate WL 1040-1 and a same SONOS gate WL 1040-0. Memory cells 1010 of a same column can be connected to a bit line (the location of two shown as 1018). In some embodiments, memory cells can have a about a 4:1 aspect ratio, being four times longer in the column direction than in the row direction.

Source lines 1042 can extend parallel to word lines (1040-0/1). Source lines 1042 and bit lines 1018 can be formed by metallization layers (not shown). Alternatively, all or a portion of a source line 1042 can be formed by a diffusion region within a substrate. Bit lines 1018 can be connected to memory cells 1010 by bit line contacts (two shown as 1074). FIG. 10 shows a region that includes a portion of two rows bounded by isolation structures 1076.

As described herein, bit lines 1018 can receive input terms ($X_j$, $X_k$), which can result in the generation of currents on source lines 1042. Such currents can correspond to weight values stored by SONOS type transistors in the memory cells. Currents can be analog MAC results 1026', which can be converted into digital values.

Figure 11A:
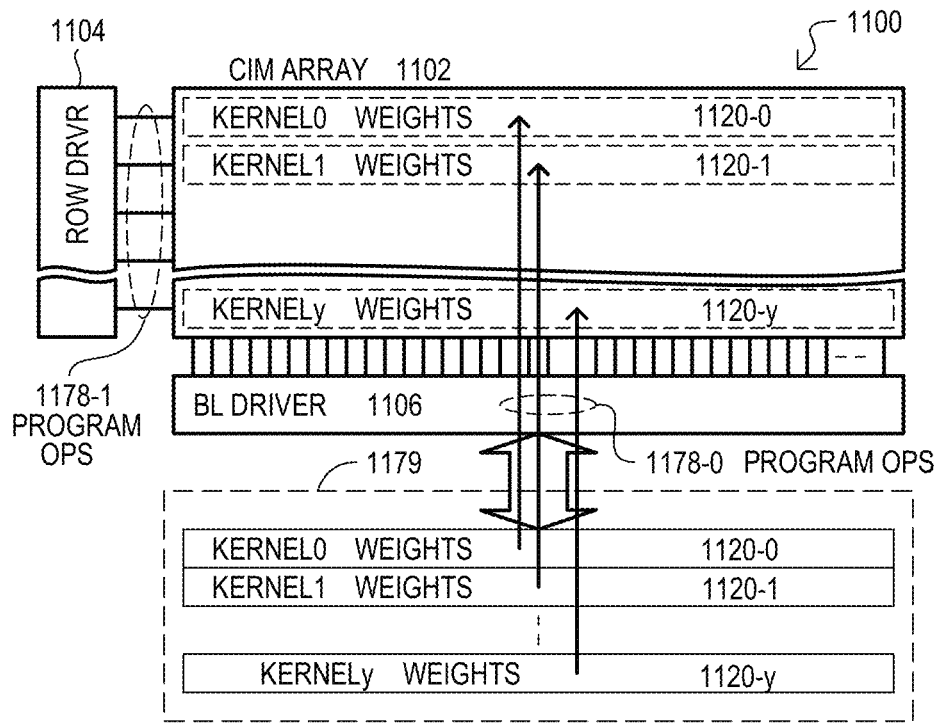
FIGS. 11A and 11B are diagrams showing program and MAC generation operations of a CIM device according to embodiments.
Figure 11B:
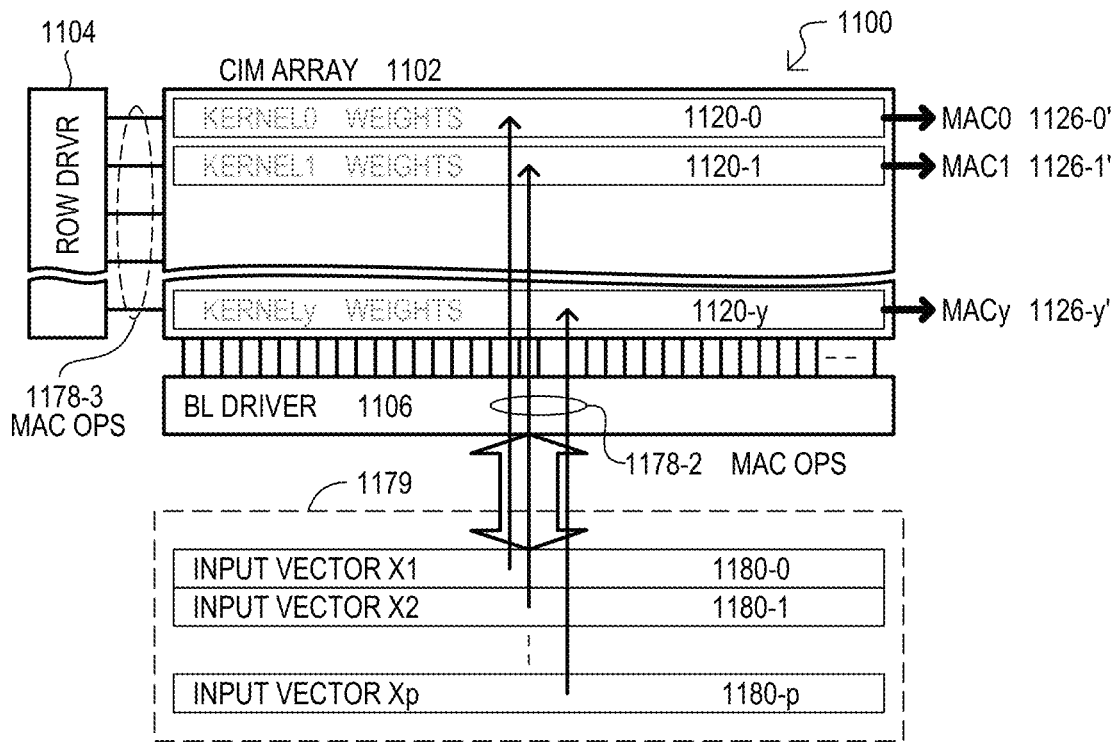

FIGS. 11A and 11B are block diagrams showing operations of a CIM device according to embodiments. FIGS. 11A and 11B show a CIM device 1100 having a CIM array 1102, row driver 1104, bit line driver 1106, and data buffer 1179. A CIM array 1102 can include one or more NVM arrays according to any of the embodiments disclosed herein, or equivalents. Row driver 1140 can drive word lines of CIM array 1102 to various potential to access (e.g., generate a MAC result) and program (including erase) memory cells therein. Similarly, bit line driver 1106 can bit lines of CIM array 1102 to various potential to access and program memory cells therein. Data buffer 1179 can store data values that are to be driven on the bit lines by bit line driver 1106.

FIG. 11A shows a programming operation that can load weight sets (kernels) into rows of CIM array 1102. According to weight values 1120-0 to -y stored in data buffer 1179, bit lines can be driven by bit line driver 1178-0 according to programming operations 1178-0. In some embodiments, bit lines can be driven based on a weight value to be stored in a memory cell. Row driver 1104 can also drive word lines according to programming operations 1178-1. Like bit lines, in some embodiments, word lines can be driven by row driver 1104 according to weight values to be stored. Source lines (not shown) can also be driven in a programming operation. As but one example, a source line of a row to be programmed can be driven to a different potential than source lines of rows that are not programmed. It is understood that such a programming step can program memory cells to any of multiple states to provide a current that can vary over a range of values.

In some embodiments, kernels can be programmed on a row-by-row basis. A set of weight values (KERNEL0) 1120-0 can be programmed into one row, followed by a next set (KERNEL1) 1120-1 programmed into a next row, etc. Kernels can be of various sizes. Accordingly, a row can fit more than one kernel and/or a kernel may fill only a portion of a row.

FIG. 11B shows a MAC generation operation according to an embodiment. In FIG. 11B it is assumed that the kernels 1120-0 to -y have been programmed into CIM array 1002. According to input values 1124-0 to -p stored in data buffer 1179, bit lines can be driven by bit line driver 1178-2. However, bit lines can be driven to voltages according to MAC operations 1178-2, which can be different from those for program operations. As described herein, in some embodiments, input values (1124-0 to -p) can be binary values. Row driver 1104 can drive word lines to select one or more rows to receive the input values on bit lines. Such row driver 1104 operations can be MAC operations, which again, can differ from program operations.

Input values (1124-0 to -p) driven on bit lines can result in currents flowing between bit lines and memory cells of a row, to generate an analog MAC result (1126-0' to -y') on source lines. Various input values (1124-0 to -p) can be applied to weight sets selected by row driver 1104.

According to embodiments, CIM arrays can be configured to generate MAC results for neurons of an artificial neural network (NN). In particular, input values to a NN layer can be applied, and MAC results for each neuron of NN layer can be generated on a different row of the CIM array.

Figure 12B:
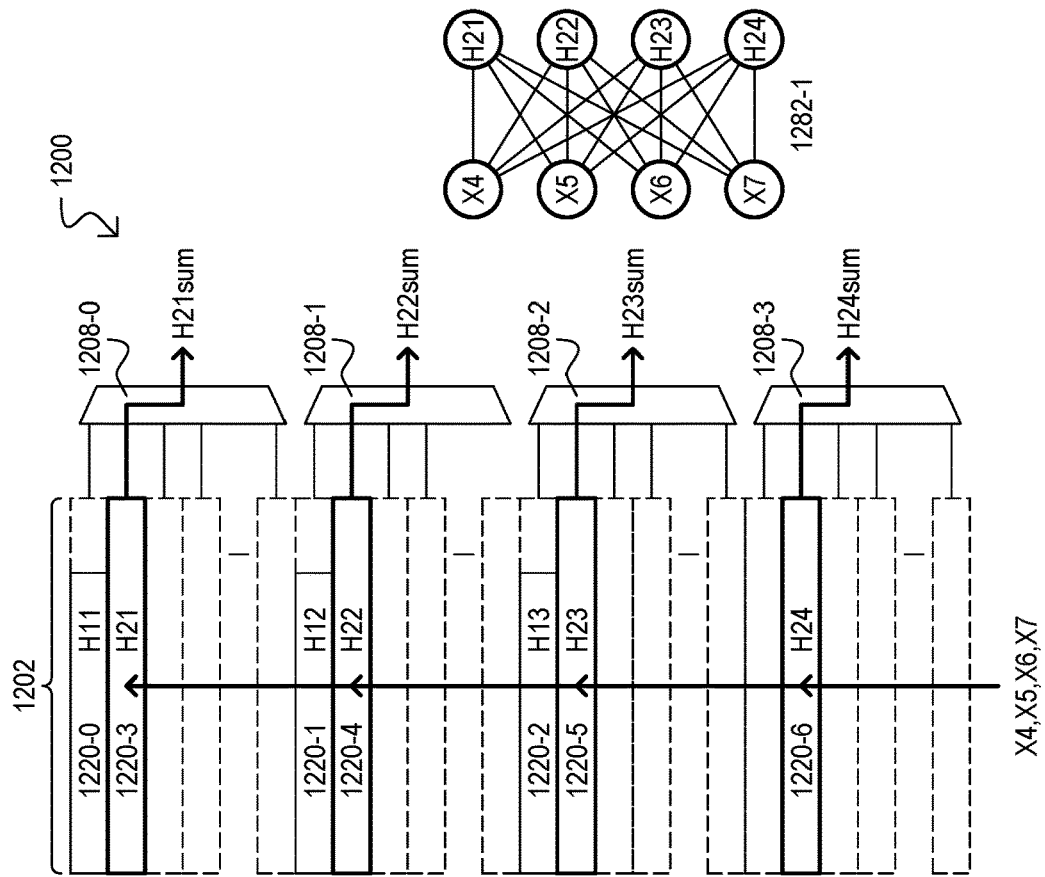
FIGS. 12A to 12D are diagrams showing neural network (NN) operations for a CIM array according to various embodiments.
Figure 12A:
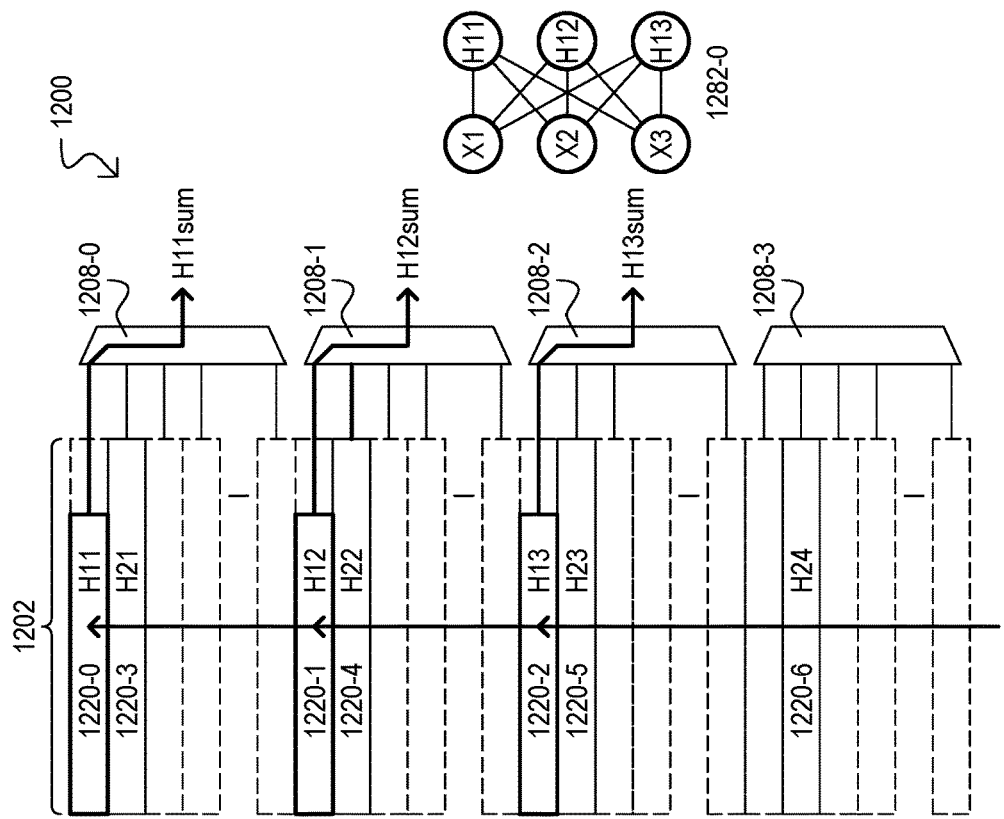

FIGS. 12A and 12B show how different sets of input values can be applied to a CIM array to generate MAC results for layers in different NN 1282-0/1. FIGS. 12A and 12B show a CIM device 1200 with a CIM array 1202 having rows connected to MUXs 1208-0 to -3. CIM array 1202 stores weight values for different neurons on rows connected to different MUXs. In the embodiment shown, NN 1282-0 includes a hidden layer formed by neurons H11, H12 and H13. Weights for these neurons 1220-0, 1220-1 and 1220-2 are stored in rows connected to MUXs 1208-0, 1208-1 and 1208-2, respectively.

FIG. 12A shows input values X1, X2, X3 for NN 1282-0 applied via bit lines to CIM array 1202. MUXs 1208-0 to -3 can be configured to select rows corresponding to the hidden layer neurons. Thus, a MAC result (H11sum) corresponding to neuron H11 can be generated with weight set H11, and output via MUX 1208-0. In a similar fashion, weight set H12 can generate MAC result (H12) corresponding to neuron H12 which is output by MUX 1208-1. Weight set H13 can generate MAC result (H12) corresponding to neuron H12 which is output by MUX 1208-1.

FIG. 12B shows the same CIM array 1202 generating MAC results for a layer of a different NN 1282-1. MUXs 1208-0 to -3 can switch rows corresponding to the hidden layer (H21, H22, H23, H24) to output MAC results (H21sum, H22sum, H23sum, H24sum) for such neurons.

The various MAC results can be analog results and can be converted into digital values by ADC circuits (not shown).

Figure 12D:
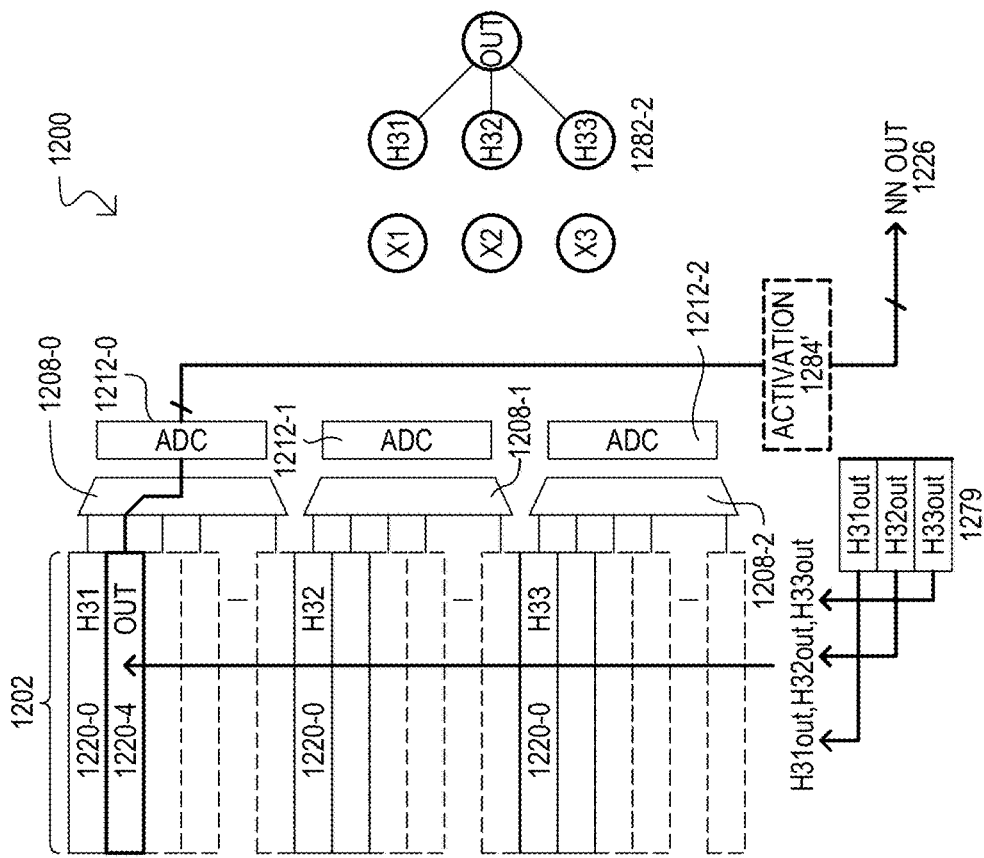
Figure 12C:
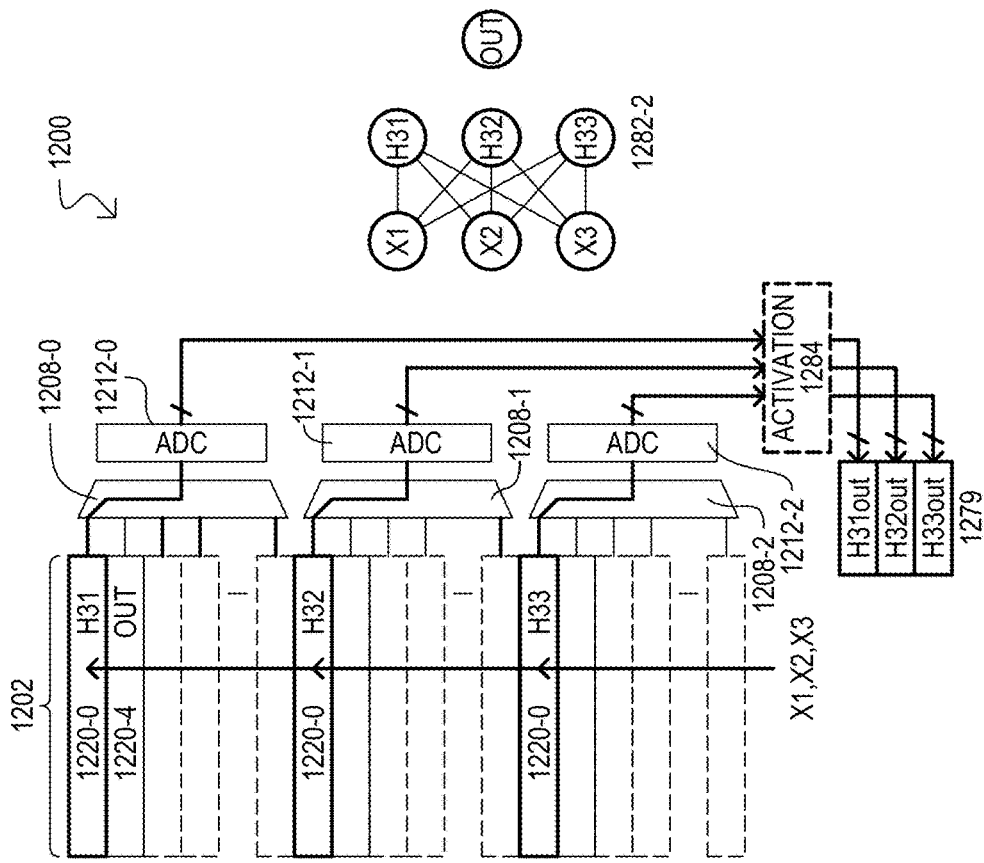

FIGS. 12C and 12D show how a CIM array can execute MAC results for layers in a same NN 1282-2 with iterative operations. FIGS. 12C/D show a CIM device 1200 having a structure like that of FIGS. 12A/B, but further shows ADC circuits 1212-0 to -2 connected to outputs of MUXs 1208-0 to -2, respectively, as well as an optional activation function circuit 1284 and a data buffer 1279.

NN 1282-2 can include a hidden layer formed by neurons H31, H32 and H33 and an output layer neuron OUT.

Weights for the hidden layer neurons 1220-0, 1220-1 and 1220-2 are stored in rows connected to MUXs 1208-0, 1208-1 and 1208-2, respectively. Weights for output neuron OUT can be stored in another row connected to MUX 1208-0.

FIG. 12C shows input values X1, X2, X3 applied via bit lines to CIM array 1202 to generate corresponding MAC results. Such MAC results can be converted into digital values by ADC circuits (1212-0 to -2), and optionally, applied to activation function(s) 1284 corresponding to each neuron. Activation can include any suitable function, including but not limited to, a sigmoid, tanh, rectified linear unit (ReLU), exponential linear unit (ELU), or maxout function. Activation functions 1284 can be implemented in any suitable manner, including but not limited to, a processor executing instructions, custom logic or programmable logic. Alternatively, activation functions can be implemented with analog circuits prior to ADC conversion.

Final neuron outputs can be stored in input buffer 1279 as values H31out, H32out and H33out.

FIG. 12D shows output values from hidden layer (H31out, H32out and H33out) being applied as input values for weights 1220-4 of output neuron OUT. This can generate a corresponding analog MAC results output by MUX 1208-0 to ADC circuit 1212-0. Optionally, a resulting digital value can be applied to an activation function 1284'. A resulting digital value can be an NN output value 1226 for NN 1282-2.

Figure 13:
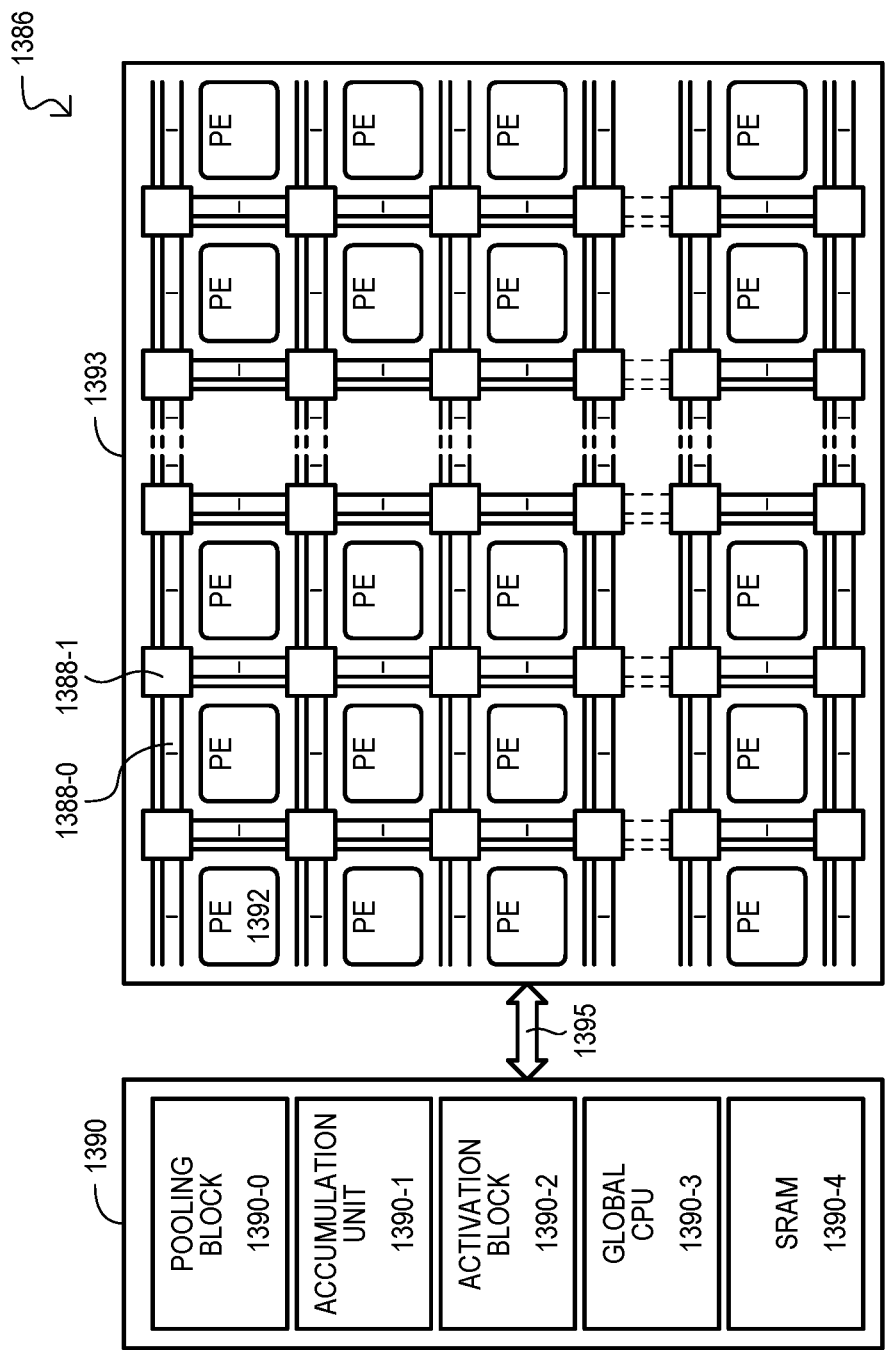
FIG. 13 is a block diagram of a CIM architecture according to an embodiment.

FIG. 13 shows a CIM architecture 1386 according to an embodiment. A CIM architecture 1386 can be realized as a system-on-chip (SoC) integrated circuit device, composed of one or more integrated circuit substrates formed in a package.

Architecture 1386 can include a configurable portion 1393 and a control portion 1390 in communication over a bus system 1395. A configurable portion 1393 can include processing elements (PEs) (one shown as 1392) formed within a configurable fabric to enable the PEs to be interconnected to one another as desired. A PE 1392 can include one or more CIM devices, as disclosed herein, or equivalents. A PE 1392 can further include additional circuits for enabling functions related to generating MAC results, including but not limited to, processing input values before they are applied to generate MAC results, as well as processing digital MAC results. In some embodiments, PE blocks (e.g., 1392) can all be formed with a single monolithic die. In the embodiments shown, a configurable fabric can include configurable buses (one shown 1388-0) and switch blocks (1388-1). Configurable buses 1388-0 can enable programmable connections to inputs and/or outputs of PEs. Switch blocks 1388-1 can enable programmable connections between configurable buses 1388-0.

A control portion 1390 can include a pooling block 1390-0, an accumulation unit 1390-1, an activation block 1390-2, a global CPU 1390-3 and memory (SRAM) 1390-4. A pooling block 1390-0 can perform pooling operations on data values, including but not limited to, aggregating data values sets according to a pooling feature. Pooling features can include but are not limited to, deriving a maximum value, a minimum value, an average value, or a mean value for a data set. Accumulation unit 1390-1 can combine outputs from multiple PEs with a bias value and generate outputs which can be further used either by one or more PEs or given as an input to pooling block 1390-0 or activation block 1390-2. Activation block 1390-2 can perform activation functions (e.g., ReLu, tanh, sigmoid, etc.) on the output generated by PEs and its output can be fed to pooling block 1390-0 or PEs. A global CPU 1390-3 can control architecture 1386 based on instructions and manages internal operation of the architecture 1386, which in some embodiments can be a single integrated circuit. Memory 1390-4 can be used by architecture for any suitable function, including by not limited to, storing configuration data for configuring buses 1388-0 and switch blocks 1388-1, and weights for PEs. In the embodiment shown, memory can include SRAM, but embodiment can include any suitable memory type.

Figure 14:
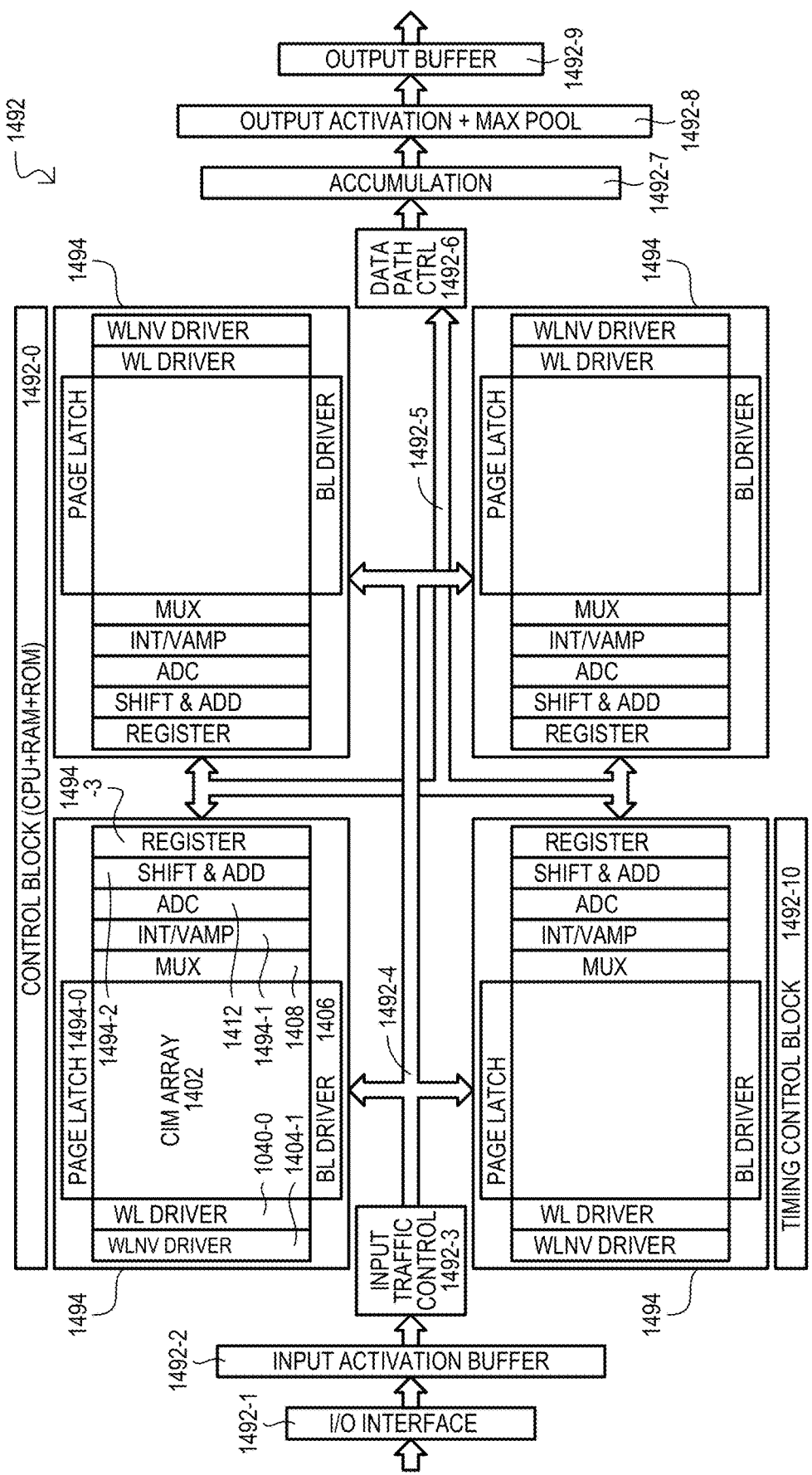
FIG. 14 is a block diagram of a processing element according to an embodiment.

FIG. 14 is a block diagram of a PE 1492 according to an embodiment. A PE 1492 can be included in an architecture like that of FIG. 13. A PE 1492 can include CIM blocks (four shown as 1494), a control block 1492-0, I/O interface 1492-1, input activation buffer 1492-2, input traffic control 1492-3, an input bus system 1492-4, an output bus system 1492-5, data path control 1492-6, accumulation section 1492-7, output activation section 1492-8, output buffer 1492-9, and timing control block 1492-10.

CIM blocks 1494 can include a CIM array 1402, bit line driver 1406, MUXs 1408, word line drivers 1040-0/1, and ADCs 1412. Such items can take the form of any of those described herein or equivalents. In addition, CIM blocks 1494 can include a page latch 1494-0, integrator/amplifier circuits 1494-1, shift/add circuits 1492-2, and block registers 1494-3. Page latch 1494-0 can store a page of data from CIM array 1402. CIM array 1402 can be programmed with non-binary weight data. While programming the weights in the CIM array 1402, the input weight data can be stored in a page latch 1494-0, which is then used during programming operations. In inference operation, the integrator/amplifier circuits 1494-1 can integrate current values provide by MUXs 1408 and amplify a resulting value prior to ADC conversion.

Shift/add circuits 1492-2 can modify digital MAC results. Block registers 1494-3 can store output values of CIM blocks 1494, for subsequent output from PE 1492. In some embodiments, block registers 1494-3 can also store input data to CIM blocks 1494. Thus, output data from one CIM block 1494 can be provided as input data to another CIM block 1494.

A control block 1492-0 can control operations of a PE 1492. In some embodiments, a control block can include a CPU and corresponding ROM and RAM. I/O interface 1492-1 can receive input data for PE 1492. Input activation buffer 1492-2 can store input data, and in some embodiments can selectively enable input data to be applied to CIM arrays, based on predetermined criteria. In some embodiments, input activation buffer 1492-4 can serve as one or more neuron input activation functions. Input traffic control 1492-3 can control which input data are applied to which CIM blocks 1494. Input traffic control 1492-3 can steer input data with any suitable method, including but not limited to, by a destination value accompanying the input data or time division multiplexing. Input bus system 1492-4 can provide a data path for input data to each CIM block 1494. Output bus system 1492-5 can provide a data path for output from each CIM block 1494. Input and output bus systems 1492-4/5 can be parallel buses, serial buses, or a combination of both.

Data path control 1492-6 can selectively pass output data from CIM blocks 1494. Accumulation section 1492-7 can accumulate output values from CIM blocks 1494. Output activation buffer 1492-8 can store output data for PE 1492 and perform activation operations (e.g., ReLu, tanh, sigmoid). In some embodiments, output activation buffer 1492-8 can serve as one or more neuron output activation functions. In some embodiments, output activation buffer 1492-8 can perform other operations on output data, including pooling or other aggregation or filtering functions. Output buffer 1492-9 can drive output data on output connections (e.g., on configurable switch fabric). Timing and control block 1492-10 can generate timing and control signal for coordinating operations of PE 1492.

Figure 15:
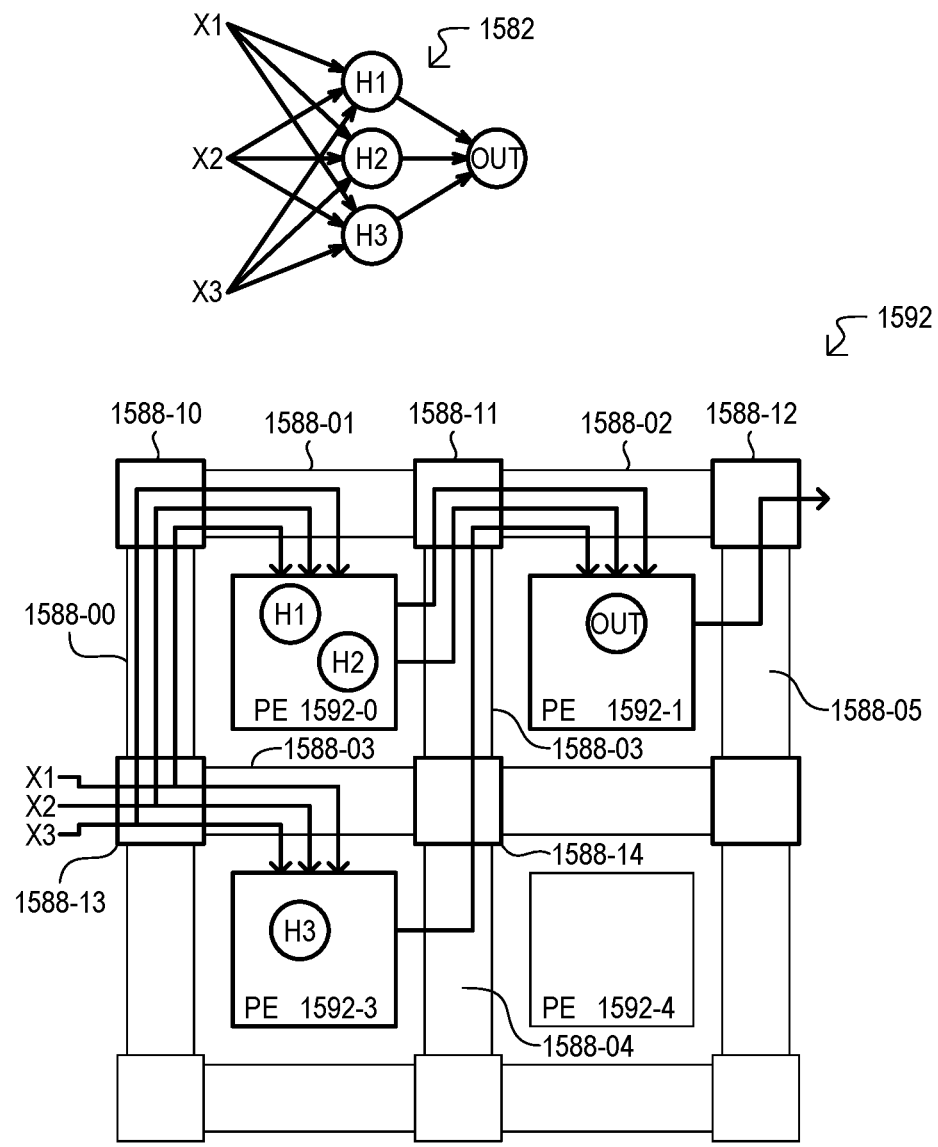
FIG. 15 are diagrams showing a CIM architecture configured to provide NN functions according to embodiments.

FIG. 15 includes diagrams showing how a CIM architecture 1592 can be configured to realize a NN 1582. CIM architecture 1592 can include PEs 1592-0 to -4, configurable buses 1588-00 to -04 and switch blocks 1588-10 to -13. In the embodiment shown, one PE 1592-0 can have a CIM array programmed with weight values corresponding to some neurons (H1, H2) of a hidden layer. PE 1592-3 can be programmed with weight values corresponding to another neuron (H3) of the same hidden layer. PE 1592-1 can have a CIM array programmed with weight values corresponding to a follow-on layer to the hidden layer. In the embodiment shown, this can be an output layer neuron (OUT).

Input values X1, X2, X3 can be provided as input values to PE 1592-0 by configuring switch blocks 1588-13, 1588-10 and configurable bus 1588-01. Input values X1, X2, X3 can also be provided as input values to PE 1592-3 by configuring switch block 1588-13 and configurable bus 1588-03. PE 1592-0 can be configured to execute MAC operations on input values X1, X2, X3 corresponding to neurons H1, H2. In some embodiments, PE 1592-0 can also execute input and/or output activation functions for the neurons H1, H2. Similarly, PE 1592-3 can be configured to execute MAC operations on input values X1, X2, X3 corresponding to neuron H3, and optionally, execute input and/or output activation functions for the neurons H3.

Output values from PE 1592-0, corresponding to outputs of neurons H1, H2, can be provided as input values to PE 1592-1 by configuring switch block 1588-11 and configurable buses 1588-03 and 1588-02. Output values from PE 1592-3, corresponding to the output of neuron H3 can be provided as input values to PE 1592-1 by configuring switch blocks 1588-14, 1588-11 and configurable buses 1588-02 and 1588-04. PE 1592-1 can be configured to execute MAC operations corresponding to neuron OUT. In some embodiments, PE 1592-1 can also execute input and/or output activation functions for neuron OUT. Output values from PE 1592-1, corresponding to an output from NN 1582, can be connected to an output of a system, or to another PE by configuring configurable bus 1588-05 and switch block 1588-12.

While embodiments above have shown various systems, devices and corresponding methods, additional methods will be described with reference to flow diagrams.

Figure 16:
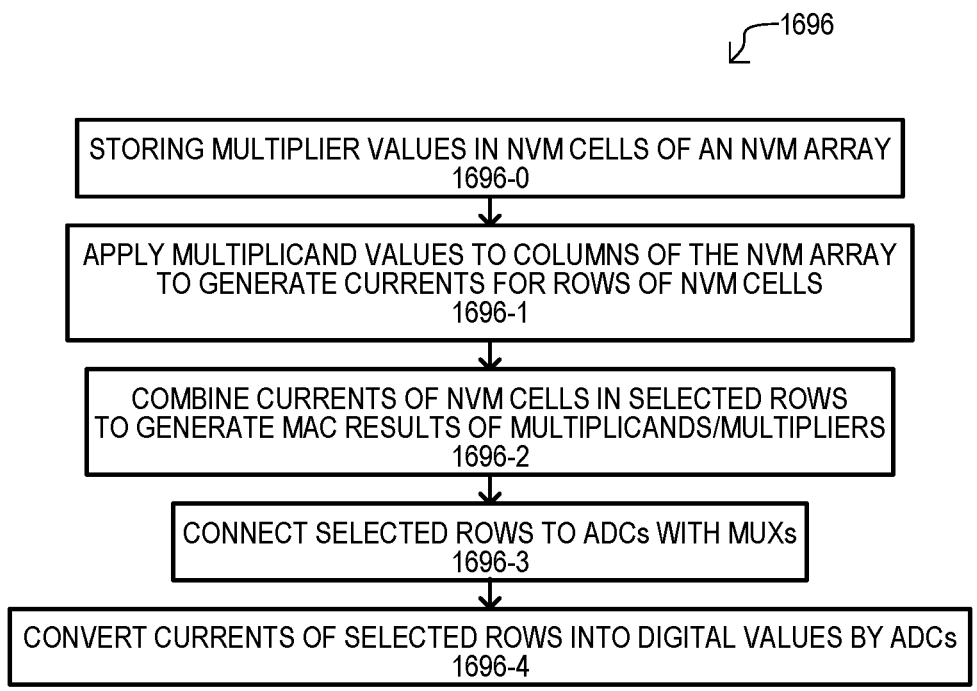
FIG. 16 is a flow diagram of a method according to an embodiment.

FIG. 16 is a flow diagram of a MAC generation method 1696 according to an embodiment. A method 1696 can include storing multiplier values in NVM cells of an NVM array 1696-0. Such an action can include programming NVM cells to store values having a range of greater than two. When selected in a MAC generation operation, a NVM cell can generate a current corresponding to a product of its stored multiplier and an input value.

A method 1696 can include applying multiplicand values to columns of the NVM array to generate currents for rows of NVM cells 1696-1. Such an action can include applying multiplicand values via bit lines of an NMV cell array. Currents for NVM cells of selected rows can be combined to generate MAC results of multiplicand/multiplier pairs 1696-2. Selected rows can be connected to ADCs with MUXs 1696-3. Such an operation can enable an ADC circuit to be shared by multiple rows of NVM cells. Currents of selected rows can be converted into digital values by ADCs 1696-4. Such conversion can be according to any suitable method and can include integrating the current with an integrating capacitor. As noted herein, for embodiments having both positive and negative multiplier values (e.g., weights), an ADC conversion can be one step taking an overall current generated by positive and negative weights. However, in other embodiments, conversion can be a two-step process, converting a positive weight value, converting the corresponding negative weight value, and subtracting the negative weight value from the positive weight value.

Figure 17:
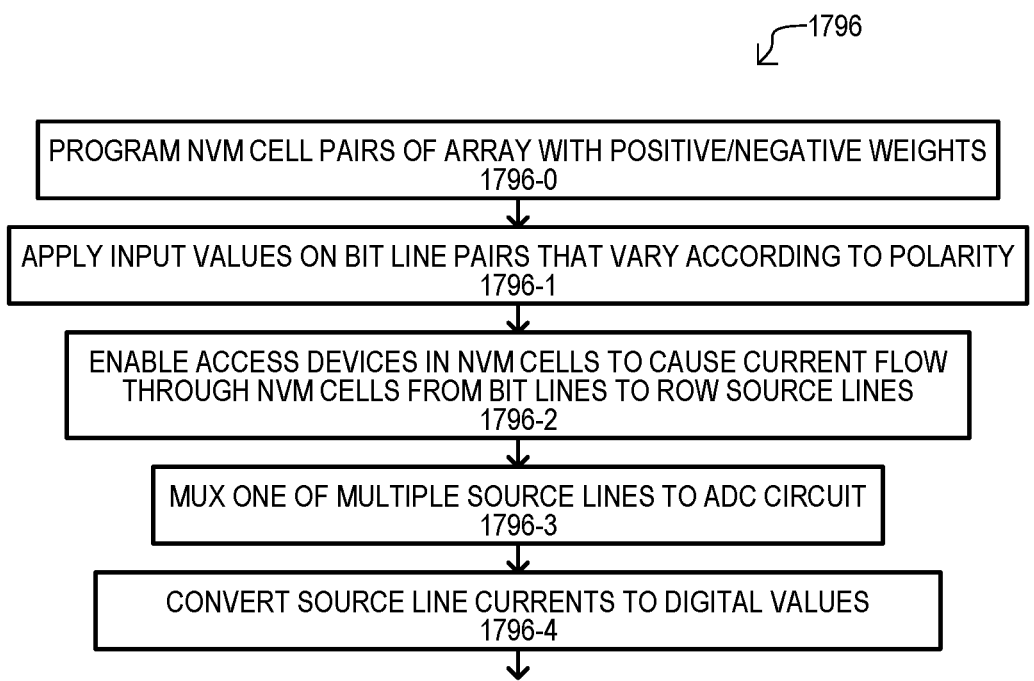
FIG. 17 is a flow diagram of another method according to an embodiment.

FIG. 17 is a flow diagram 1796 of a method for generating MAC results with input (e.g., multiplicand values) that can have different polarities. A method 1796 can include programming NVM cell pairs with positive and negative weights. Such an action can include programming two weight values for each expected input value, where the positive weight value will increase a MAC result while the negative weight value will decrease the MAC result. A method 1796 can include applying input values on bit line pairs that vary according to polarity 1796-1. Such an action can include driving bit lines pairs to different voltages based on whether the input value is positive or negative. In some embodiments, for a positive input value, a first bit line can be driven to a relatively high voltage, while a second bit line can be driven to a relatively low voltage. For a negative input values, voltage levels on the bit line pair can be switched.

Access devices in NVM cells can be enabled to cause current to flow through the NVM cells from bit lines to row source lines 1796-2. In some embodiments, such an action can include activating word lines for rows of NVM cells. Further, source lines can be dedicated to rows. A method 1796 can include multiplexing one of multiple source lines to an ADC circuit 1796-3. Currents on source lines can be converted into digital values 1796-4.

Figure 18:
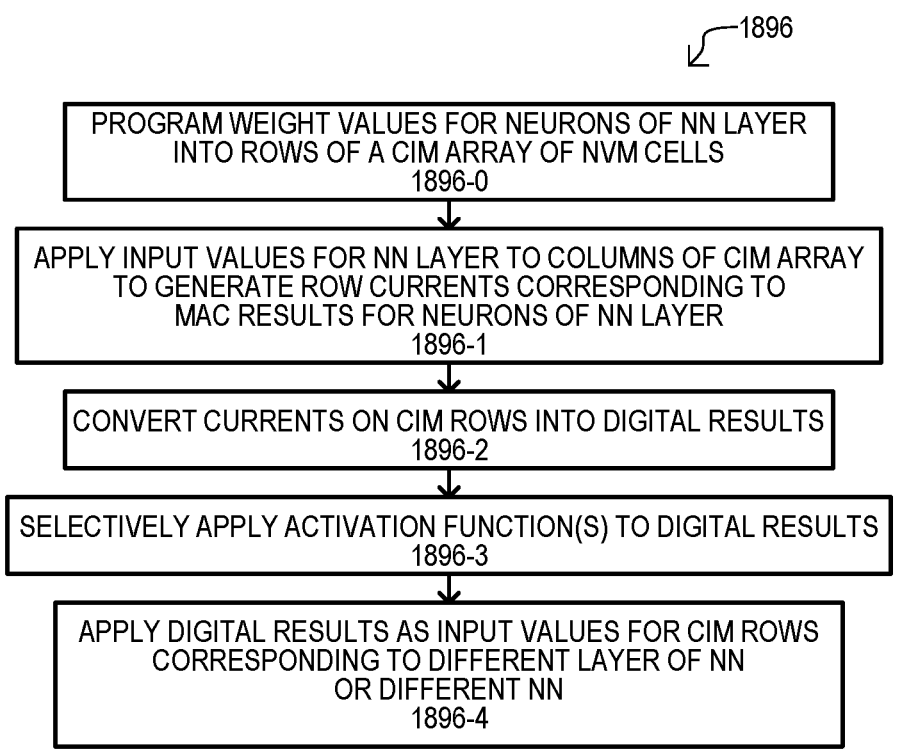
FIG. 18 is a flow diagram of a further method according to an embodiment.
Figure 19:
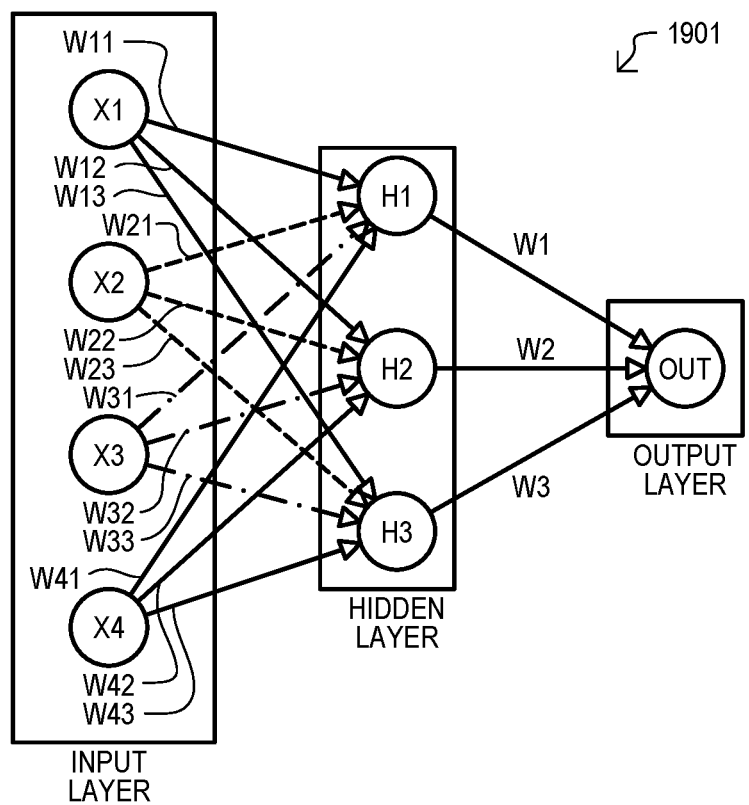
FIG. 19 is a diagram of a NN.
Figures 20A, 20B:
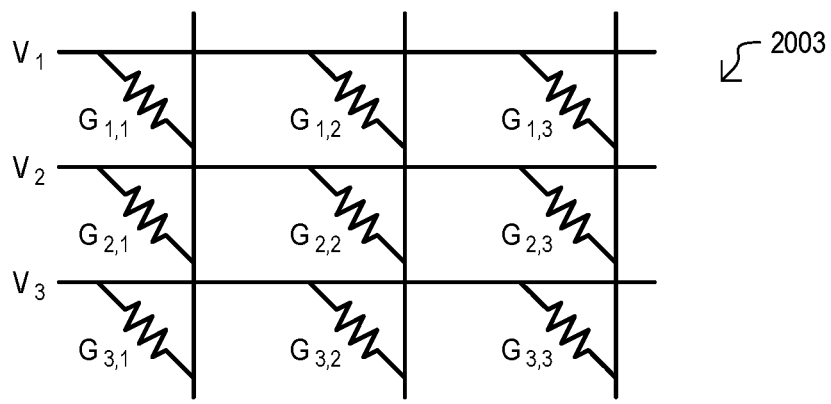
FIG. 20A is a diagram showing conventional matrix operations giving rise to multiply-accumulate (MAC) operations.
FIG. 20B is a diagram of a conventional cross point array for generating MAC results.
Figure 22:
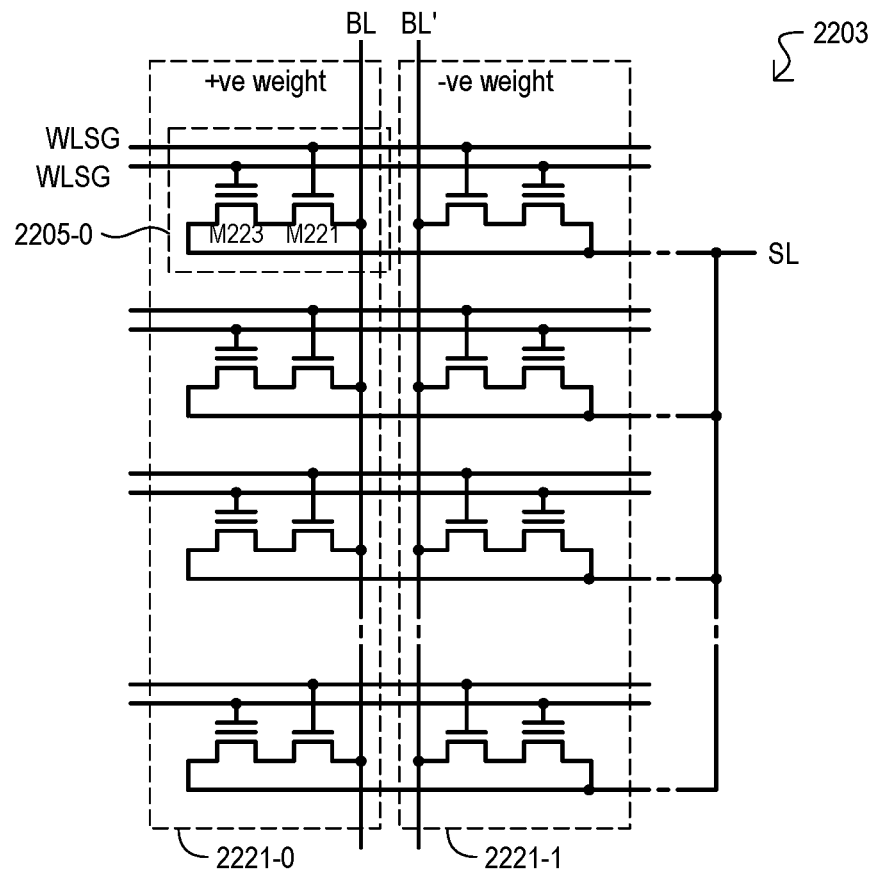
FIG. 22 is a schematic diagram of a conventional CIM array.

FIG. 18 shows a method 1896 of performing NN operations on a CIM device according to an embodiment. A method 1896 can include programming weight values for neurons of a NN layer into rows of a CIM array of NVM cells 1896-0. Input values for the NN layer can be applied to columns of the CIM array to generate row currents. Row currents can correspond to a MAC result for the neurons of the NN layer 1896-1.

Currents on CIM rows can be converted into digital results 1896-2. Activation functions can be applied to the digital results 1896-3. The digital results can then be applied as input values for CIM rows corresponding to a different layer of the NN, or to a different NN 1896-4. Such an action can include enabling programmable paths between different CIM arrays of a CIM device.

Embodiments can provide various advantages over conventional approaches.

The number of MUXs used to connect analog currents to ADC circuits can be reduced, particularly if NVM cell aspect ratio is greater in the column direction than the row direction. For NVM arrays having NVM cells with a 4:1 aspect ratio, a number of MUXs can be reduced by about a factor of four.

Embodiments can provide for a shorter integration paths for ADC conversions. In conventional approaches, a MAC current value can be provided on bit lines. In contrast, embodiments can provide such a current on source lines, which can be shorter than bit lines.

Similarly, embodiments can provide greater integrating current range, as a source line can have a lower resistance than a bit line. For NVM arrays having NVM cells with a 4:1 aspect ratio, the IR drop in the conversion path can be reduced by about a factor of four.

According to embodiments, MAC operations can be executed with signed input values without having to repeat positive and negative columns in an array, providing for more efficient use of CIM array space.

According to embodiments, a CIM device can have increased accuracy over conventional approaches. Weight value sets (e.g., kernels) can be updated on a row-wise basis. This can enable a weight value set to be updated with a single programming operation, as opposed to multiple such operations when one kernal's weight sets are stored in multiple columns and rows. Along these same lines, updating weight values can be simpler and faster.

Other advantages would be well understood by those skilled in the arts.

Embodiments can enjoy wide applications in various fields to provide fast, easily updated MAC operations, in a highly parallel fashion. Embodiments can be advantageously employed to provide neural networks which can execute fast, power efficient inference operations. Further, neural networks can undergo faster learning operations as neuron weight values can be quickly and accurately updated.

Other applications would be well understood by those skilled in the arts.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method, comprising:
    storing weight values in storage elements of nonvolatile memory (NVM) cells of a NVM cell array, the NVM cell array having rows and columns, wherein one row and one column of the NVM cells are coupled to a word line and a bit line respectively;
    for at least one row, generating a multiply-accumulate (MAC) result for the row by applying input values on bit lines, each MAC result comprising a summation of an analog current or voltage that is a function of each input value and a corresponding weight value stored by the NVM cells of the row; and
    by operation of at least one multiplexer, connecting one of a plurality of the rows to an analog-to-digital converter (ADC) circuit to convert the analog current or voltage of the row into a digital MAC value; wherein the storage element of each NVM cell is configured to store a weight value that can vary between no less than three different values.

2. The method of claim 1, wherein:
storing weight values in the storage elements includes, for each NVM cell, programming a charge storing layer of an insulated gate field effect transistor (IGFET) device of the NVM cell to establish of threshold voltage of the IGFET device.

3. The method of claim 2, wherein:
the charge storing layer comprises a nitride layer.

4. The method of claim 1, wherein:
storing weight values in the storage elements includes storing one weight value set in one selected row, the weight value sets corresponding to multiplier values of a MAC operation;
applying input values includes applying multiplicand values for the MAC operation to the selected row; and
generating the MAC results includes generating a MAC result for each selected row that corresponds to a summation of each multiplicand value multiplied by a different multiplier value.

5. The method of claim 4, further including:
converting the MAC result of each selected row into a digital value with a different ADC circuit.

6. The method of claim 1, further including:
accumulating digital MAC values for a plurality of rows to generate a set of output values;
coupling the output values to a second NVM cell array via a programmable connection fabric; and
generating second MAC results with the second NVM cell array by applying the output values as second array input values on bit lines of the second NVM cell array.

7. The method of claim 1, wherein:
each NVM cell includes a select device and a corresponding storage element, the storage element programmable between no less than three different conductance states; and
generating a MAC result for the row includes enabling a select device in each NVM cell of the row to couple the corresponding storage element to a bit line; wherein
each storage element of a row is conductively coupled to source line for the row and no other rows, and the MAC result is a current flow on the source line.

8. A nonvolatile memory (NVM) device, comprising:
at least one NVM array comprising a plurality of NVM cells arranged into rows and columns, each NVM cell configured to store a weight value and provide a cell voltage or current that varies according to the weight value;
a plurality of bit lines, each bit line coupled to a column of the NVM cell array;
a plurality of word lines, each word line coupled to a corresponding row of NVM cells, each configured to select the NVM cells of the corresponding row;
a plurality of separate source lines, each coupled to a different row of NVM cells;
a plurality of multiplexers (MUXs), each having MUX inputs coupled to a different set of source lines, and each configured to selectively connect one MUX input to a MUX output; and
a plurality of analog-to-digital converter (ADC) sections, each coupled to a MUX output of a different MUX; wherein each NVM cell is programmable between no less than three different weight values.

9. The NVM device of claim 8, wherein:
the each NVM cell comprises an insulated gate field effect transistor (IGFET) device having a threshold voltage representing the weight value stored by the NMV cell.

10. The NVM device of claim 9, wherein:
each IGFET device has a charge storing gate layer selected from the group of: an oxide-nitride-oxide layer and a hi-k dielectric layer, nitride layer and oxide layer.

11. The NVM device of claim 8, wherein:
each ADC section includes
an integrator circuit configured to integrate an analog signal generated on a source line selected by a corresponding MUX to generate an integrated analog value, and
an ADC circuit configured to convert the integrated analog value into a digital value.

12. The NVM device of claim 8, further including:
a bit line driver circuit coupled to the bit lines and configured to drive each bit line between any selected from the group of:
at least two different voltage levels in response to an input value and an analog voltage range.

13. The NVM device of claim 12, wherein:
the NVM cells of each row comprise adjacent cell pairs, each cell pair including a first NVM cell configured to a store a positive weight value, and
a second NVM cell configured to store a negative weight value;
the bit lines comprise bit line pairs; and
the bit line driver circuit is configured to drive bit line pairs to complementary values based on a polarity of an input value.

14. The NVM device of claim 8, wherein:
each source line has a lower resistance than each bit line.

15. A system, comprising:
a plurality of processing elements (PE), each PE including:
a plurality of nonvolatile memory (NVM) arrays, each NVM array comprising NVM cells arranged into rows and columns, the NVM cells of each row coupled to a word line, the NVM cells of each column coupled to a bit line, each row configured to;
store weight values in NVM cells of the row, and
generate a multiply accumulate (MAC) result by application of an input values to NVM cells of the row, each MAC result comprising a summation of an analog current or voltage that is a function of each input value and a corresponding weight value stored by the NVM cells of the row,
a plurality of analog-do-digital converters (ADC), each configured to convert a MAC result from a selected row into a digital MAC value, and
pooling circuits configured to aggregate sets of accumulated digital MAC values; and
circuits configurable to conductively interconnect the PEs to one another.

16. The system of claim 15, wherein:
the PEs are formed with a same semiconductor substrate.

17. The system of claim 15, wherein:
each PE further includes an accumulation circuit coupled to the NVM arrays and configured to accumulate digital MAC values.

18. The system of claim 15, wherein:
the circuits comprise a configurable switch fabric that includes a plurality of configurable buses coupled to the PEs, and a plurality of switch blocks configurable to connect configurable buses to one another.

19. The system of claim 15, wherein:
the plurality of the PEs are configured into at least one neural network, including:
a first group of PEs configured as neurons of a hidden layer, each first group PE coupled to receive input values and apply such values to their at least one NVM array to generate digital MAC values, and
at least one PE configured as an output neuron and coupled to receive digital MAC values generated by the hidden layer as input values.

* * * * *